US012094530B2

(12) United States Patent
Luo et al.

(10) Patent No.: US 12,094,530 B2
(45) Date of Patent: Sep. 17, 2024

(54) JOSEPHSON STATIC RANDOM ACCESS MEMORY

(71) Applicant: IMEC VZW, Leuven (BE)

(72) Inventors: Henry Luo, Kissimmee, FL (US); Anna Yurievna Herr, Leuven (BE); Quentin Paul Herr, Leuven (BE)

(73) Assignee: IMEC VZW, Leuven (BE)

( * ) Notice: Subject to any disclaimer, the term of this patent is extended or adjusted under 35 U.S.C. 154(b) by 54 days.

(21) Appl. No.: 17/815,358

(22) Filed: Jul. 27, 2022

(65) Prior Publication Data

US 2024/0038298 A1   Feb. 1, 2024

(51) Int. Cl.
*G11C 11/44* (2006.01)

(52) U.S. Cl.
CPC .................... *G11C 11/44* (2013.01)

(58) Field of Classification Search
CPC ........................................ G11C 11/44
USPC ............................................. 365/162
See application file for complete search history.

(56) References Cited

U.S. PATENT DOCUMENTS

| 8,571,614 | B1* | 10/2013 | Mukhanov | H10N 60/10 29/829 |
| 10,777,263 | B1 | 9/2020 | Herr et al. | |
| 10,902,908 | B2 | 1/2021 | Herr et al. | |
| 11,476,842 | B1* | 10/2022 | Bhattacharya | G06N 10/00 |
| 2018/0101786 | A1* | 4/2018 | Boothby | H10N 60/12 |
| 2019/0362780 | A1* | 11/2019 | Burnett | H10N 60/805 |

FOREIGN PATENT DOCUMENTS

JP    0506345  A2 *  9/1992  ............ H03M 7/003

OTHER PUBLICATIONS

Polonsky, S. V., A. F. Kirichenko, V. K. Semenov, and K. K. Likharev. "Rapid single flux quantum random access memory." IEEE Transactions on Applied Superconductivity 5, No. 2 (1995): 3000-3005.
Silver, A., R. Phillips, and R. Sandell. "High speed non-latching SQUID binary ripple counter." IEEE Transactions on Magnetics 21, No. 2 (1985): 204-207.
Braiman, Yehuda, N. Nair, J. Rezac, and Neena Imam. "Memory cell operation based on small Josephson junctions arrays." Superconductor Science and Technology 29, No. 12 (2016): 124003.

(Continued)

*Primary Examiner* — Hoai V Ho
*Assistant Examiner* — Minh Dinh
(74) *Attorney, Agent, or Firm* — McDonnell Boehnen Hulbert & Berghoff LLP

(57) ABSTRACT

Josephson junction based memory devices and methods for their use are described herein. An example Josephson junction based memory device includes a plurality of superconducting loops. Each superconducting loop includes at least one Josephson junction. The plurality of superconducting loops are electrically coupled. The plurality of superconducting loops include a plurality of input loops, a plurality of readout loops, and at least one shared loop. The plurality of superconducting loops are configured to store or annihilate magnetic flux quanta in one or more of the superconducting loops in response to a combination of control signals and single flux quantum (SFQ) pulses.

16 Claims, 31 Drawing Sheets

(56) References Cited

OTHER PUBLICATIONS

Burnett, Randall, Ryan Clarke, Timothy Lee, Harold Hearne, Jacob Vogel, Quentin Herr, and Anna Herr. "Demonstration of superconducting memory for an RQL CPU." In Proceedings of the International Symposium on Memory Systems, pp. 321-323. 2018.

Castellano, Maria Gabriella, Fabio Chiarello, Guido Torrioli, and Pasquale Carelli. "Static flux bias of a flux qubit using persistent current trapping." Superconductor Science and Technology 19, No. 11 (2006): 1158.

* cited by examiner

Figure 7

JOSEPHSON STATIC RANDOM ACCESS MEMORY

FIELD OF THE DISCLOSURE

This application relates to superconducting circuits. In particular, this application discloses a static random access memory (SRAM) implemented using a plurality of superconducting Josephson junctions (JJ) and related circuitry. Such a memory may be configured to encode information in the form of magnetic flux quanta and may transfer such information based on single flux quantum (SFQ) pulses.

BACKGROUND

Superconducting digital systems are capable of performing computing operations at clock speeds in excess of 100 GHz. In these systems, the circuits comprise superconducting wires and Josephson junctions that together form superconducting loops in which information in the form of a single flux magnetic quantum is encoded and stored.

The superconducting circuits can be configured to implement traditional logic gates such as AND gates, OR gates, Flip Flops, etc. These gates, in turn, can be configured to implement more complex logic such as shift registers, counters, processors, etc.

However, there exists a need for JJ-based SRAM that: 1) is sufficiently fast and dense; 2) supports multiple read and write ports; and 3) can be fabricated in the same process/stackup as corresponding JJ-based logic circuits.

SUMMARY

In a first aspect, a Josephson junction based memory device is provided. The Josephson junction based memory device includes a plurality of superconducting loops. Each superconducting loop includes at least one Josephson junction. The plurality of superconducting loops are electrically coupled. The plurality of superconducting loops includes a plurality of input loops, a plurality of readout loops, and at least one shared loop. The plurality of superconducting loops are configured to store or annihilate magnetic flux quanta in one or more of the superconducting loops in response to a combination of control signals and single flux quantum (SFQ) pulses.

In a second aspect, a method for storing digital information in a Josephson junction based memory device is provided. The method includes providing, to a plurality of superconducting loops, a combination of control signals and single flux quantum (SFQ) pulses. Each superconducting loop includes at least one Josephson junction. The plurality of superconducting loops are electrically coupled. The plurality of superconducting loops includes a plurality of input loops, a plurality of readout loops, and at least one shared loop. The method also includes, in response to the combination of control signals and SFQ pulses, storing or annihilating magnetic flux quanta in one or more of the superconducting loops.

BRIEF DESCRIPTION OF THE FIGURES

The above, as well as additional features, will be better understood through the following illustrative and non-limiting detailed description of example embodiments, with reference to the appended drawings.

FIG. 7 illustrates a wave-pipelining arrangement of the array of unit cells, in accordance with example embodiments.

Figure 1:
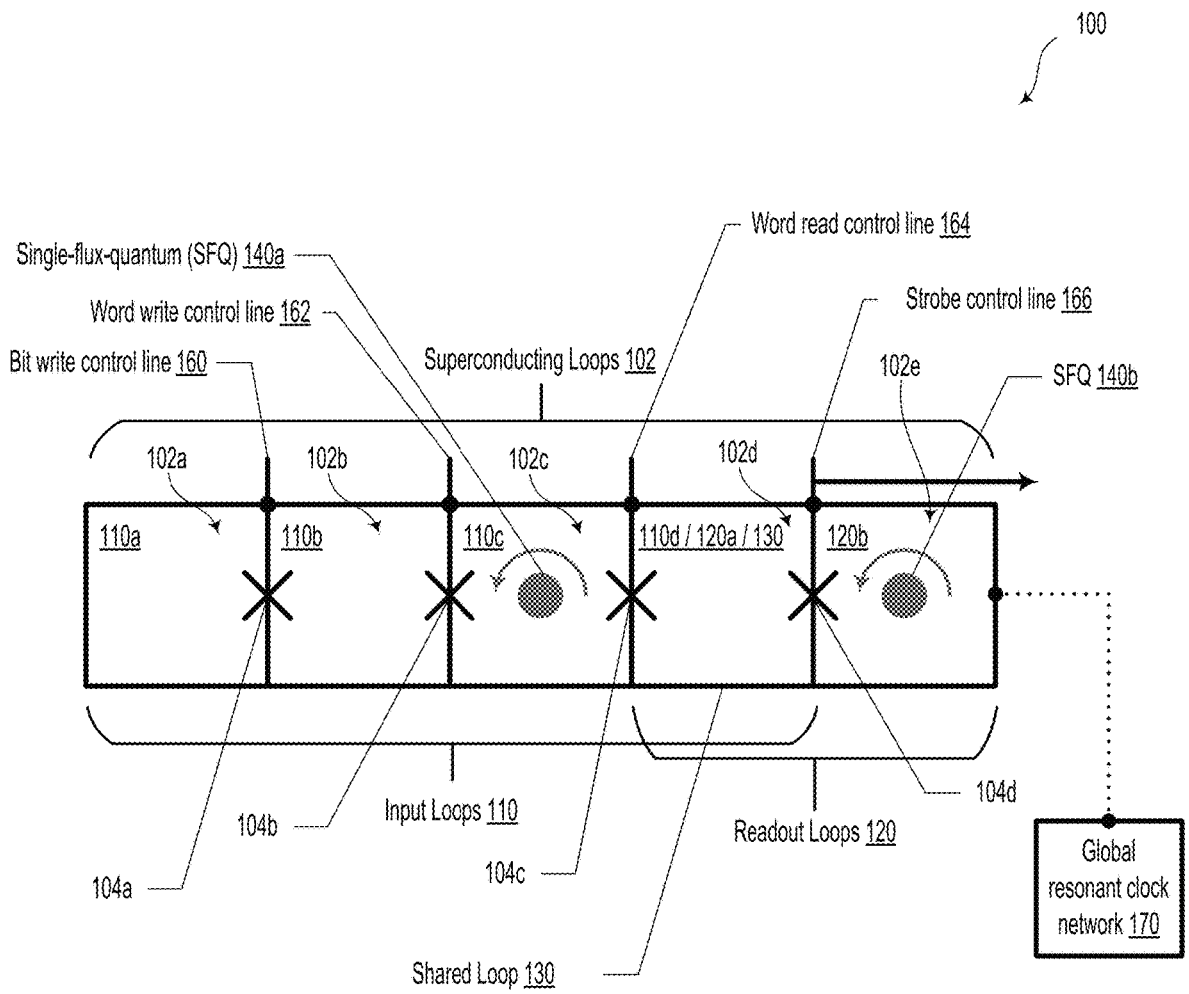
FIG. 1 illustrates a schematic diagram of a Josephson junction based memory device, in accordance with example embodiments.

All the figures are schematic, not necessarily to scale, and generally only show parts that are necessary to elucidate example embodiments, wherein other parts may be omitted or merely suggested.

DETAILED DESCRIPTION

Various examples of systems, devices, and/or methods are described herein with reference to the accompanying drawings. Any embodiment, implementation, and/or feature described herein as being an example is not necessarily to be construed as preferred or advantageous over any other embodiment, implementation, and/or feature unless stated as such. Thus, other embodiments, implementations, and/or features may be utilized, and other changes may be made without departing from the scope of the subject matter presented herein.

Accordingly, the examples described herein are not meant to be limiting. It will be readily understood that the aspects of the present disclosure, as generally described herein, and illustrated in the figures, can be arranged, substituted, combined, separated, and designed in a wide variety of different configurations.

Further, unless the context suggests otherwise, the features illustrated in each of the figures may be used in combination with one another. Thus, the figures should be generally viewed as component aspects of one or more overall embodiments, with the understanding that not all illustrated features are necessary for each embodiment.

Additionally, any enumeration of elements, blocks, or steps in this specification or the claims is for purposes of clarity. Thus, such enumeration should not be interpreted to require or imply that these elements, blocks, or steps adhere to a particular arrangement or are carried out in a particular order.

Moreover, terms such as "substantially" or "about" that may be used herein are meant that the recited characteristic, parameter, or value need not be achieved exactly, but that deviations or variations, including, for example, tolerances, measurement error, measurement accuracy limitations and other factors known to those skilled in the art, may occur in amounts that do not preclude the effect the characteristic was intended to provide.

Further, terms such as "A coupled to B," "A electrically coupled to B," etc., do not necessarily mean that items A and B are directly coupled to one another. For example, a first component electrically coupled to a second component is interpreted to mean that the components are either directly coupled (e.g., via a conductor) or coupled to one another via one or more resistors, capacitors, inductors, and/or other active or passive components.

The potential of superconducting digital technology as a beyond-CMOS technology derives from high energy efficiency, high computational density, and high interconnect bandwidth. The technology is based on the single-flux-quantum (SFQ) pulse, which is fast, low power, and low-dispersion/low-loss on superconductor transmission lines. Example embodiments involve various combinations of fabrication materials, density, power/clock distribution, logic and memory design, packaging, interfaces, and architecture. Logic devices based on such technologies are projected to have a computational density on par with leading-node CMOS based on an integration scale up 400 M JJ/cm$^2$ and a clock rate of 30 GHz.

High performance logic requires on-chip memory that 1) is sufficiently fast and dense, 2) supports multiple read and write ports, and 3) can the fabricated in the same process/stackup as the logic. With respect to conventional CMOS logic technologies, static random access memory (SRAM) satisfies these requirements. The presently described Josephson junction static random access memory (JSRAM) fulfills these requirements for superconducting SFQ logic and represents an analogue of SRAM.

X-Y addressing and readout is accomplished in JSRAM by moving stored SFQ between a series arrangement of adjacent superconducting loops. Conventional Josephson Transmission Line (JTL) interconnects provides high fan-out across the memory array. The present JSRAM design is extensible to multiple read and write ports.

The JSRAM design avoids exotic devices such as magnetics and so can be fabricated in the same process/stackup as that of high-performance SFQ logic. Furthermore, JSRAM utilizes the native SFQ logic signals and thus avoids the need for potentially complex conversion processes and hardware. The JSRAM design also avoids physically large components such as transformers, achieving a design density of 5 MB/cm$^2$ using 193i lithography. Wave pipelining allows throughput equal to the clock rate of the logic, with density that is a 500× advance over conventional devices.

Example Josephson Junction Based Memory Devices

FIG. 1 illustrates a schematic diagram of a Josephson junction based memory device 100, in accordance with example embodiments. The Josephson junction based memory device 100 includes a plurality of superconducting loops 102. Each superconducting loop (e.g., superconducting loop 102a, 102b, 102c, 102d, or 102e) includes at least one Josephson junction (e.g., Josephson junction 104a, 104b, 104c, and/or 104d). In such scenarios, the plurality of superconducting loops 102 are electrically coupled to one another.

Furthermore, the plurality of superconducting loops 102 can include a plurality of input loops 110 and a plurality of readout loops 120. As illustrated in FIG. 1, the input loops 110 of a write path overlap with the readout loops 120 of a read path. That is, input loop 110d and readout loop 120a utilize the same superconducting loop, which can be termed as a "shared loop" (e.g., shared loop 130).

Put another way, as illustrated in FIG. 1, the plurality of superconducting loops 102 could be electrically coupled in a series arrangement. In some examples, the series arrangement can include five superconducting loops (e.g., superconducting loops 102a, 102b, 102c, 102d, and 102e), of which four are input loops (e.g., input loops 110a, 110b, 110c, and 110d), two are readout loops (e.g., readout loops 120a and 120b), and one is a shared loop (e.g., shared loop 130). In such scenarios, each superconducting loop of the plurality of superconducting loops 102 has one or two adjacent loops. As an example, superconducting loop 102a has one adjacent loop (superconducting loop 102b), superconducting loop 102b has two adjacent loops (superconducting loop 102a and superconducting loop 102c), superconducting loop 102c has two adjacent loops (superconducting loop 102b and superconducting loop 102d), superconducting loop 102d has two adjacent loops (superconducting loop 102c and superconducting loop 102e), and superconducting loop 102e has one adjacent loop (superconducting loop 102d). It will be understood that other arrangements of the superconducting loops 102 are possible and contemplated in relation to the present disclosure.

The Josephson junction based memory device 100 also includes a plurality of address lines coupled to the plurality of superconducting loops 102. In some embodiments, each address line of the plurality of address lines 102 could include a Josephson transmission line and a current-bias source. Furthermore, the current-bias source may provide an AC signal corresponding to a global resonant clock network 170, which may provide a system-wide clock to help enable operation in a synchronized manner.

In such embodiments, each address line of the plurality of address lines also includes a resistor connected between the Josephson transmission line and a corresponding superconducting loop of the plurality of superconducting loops 102.

The plurality of superconducting loops 102 are configured to store or annihilate magnetic flux quanta (e.g., SFQ 140a or SFQ 140b) in one or more of the superconducting loops in response to a combination of control signals and single flux quantum (SFQ) pulses.

In an example embodiment, the control signals could be provided to the superconducting loops 102 by way of a bit write control line 160, a word write control line 162, a word read control line 164, and/or a strobe control line 166. Furthermore, the plurality of superconducting loops 102 are coupled to the global resonant clock network 170.

In some embodiments, the plurality of superconducting loops 102 are configured to shift a magnetic flux quanta (e.g., SFQ 140a) from an initial superconducting loop (e.g., superconducting loop 102c) to an adjacent loop (e.g., superconducting loop 102b) in response to a SFQ pulse applied to the initial superconducting loop.

The JSRAM write path involves moving a stored single-flux-quantum (SFQ) between superconducting loops separated by Josephson junctions (JJs), and the read path involves sensing the location of the stored SFQ. Specific write and read operations will be described in further detail below.

The operating principle involves addition of currents in the Josephson junctions (e.g., Josephson junctions 104a, 104b, 104c, and 104d): a SFQ will move one stage to the left if a positive signal current adds constructively to the stored SFQ, which is a persistent current in the superconducting loop. Alternatively, the SFQ will move one loop to the right if a negative signal current adds to a negative current in the stored SFQ.

The control signals for the write operation are Word Write (WW) and Bit Write (BW), with polarity indicated by (+) or (−). Note that Strobe (S) signals will pass through to the output (Q) irrespective of the state of the cell, if the state of the cell is not being readout.

In such a manner, the plurality of superconducting loops 102 could be configured to provide information indicative of a presence of the magnetic flux quanta in one or more of the superconducting loops in response to a combination of control signals and SFQ pulses.

Figure 2A:
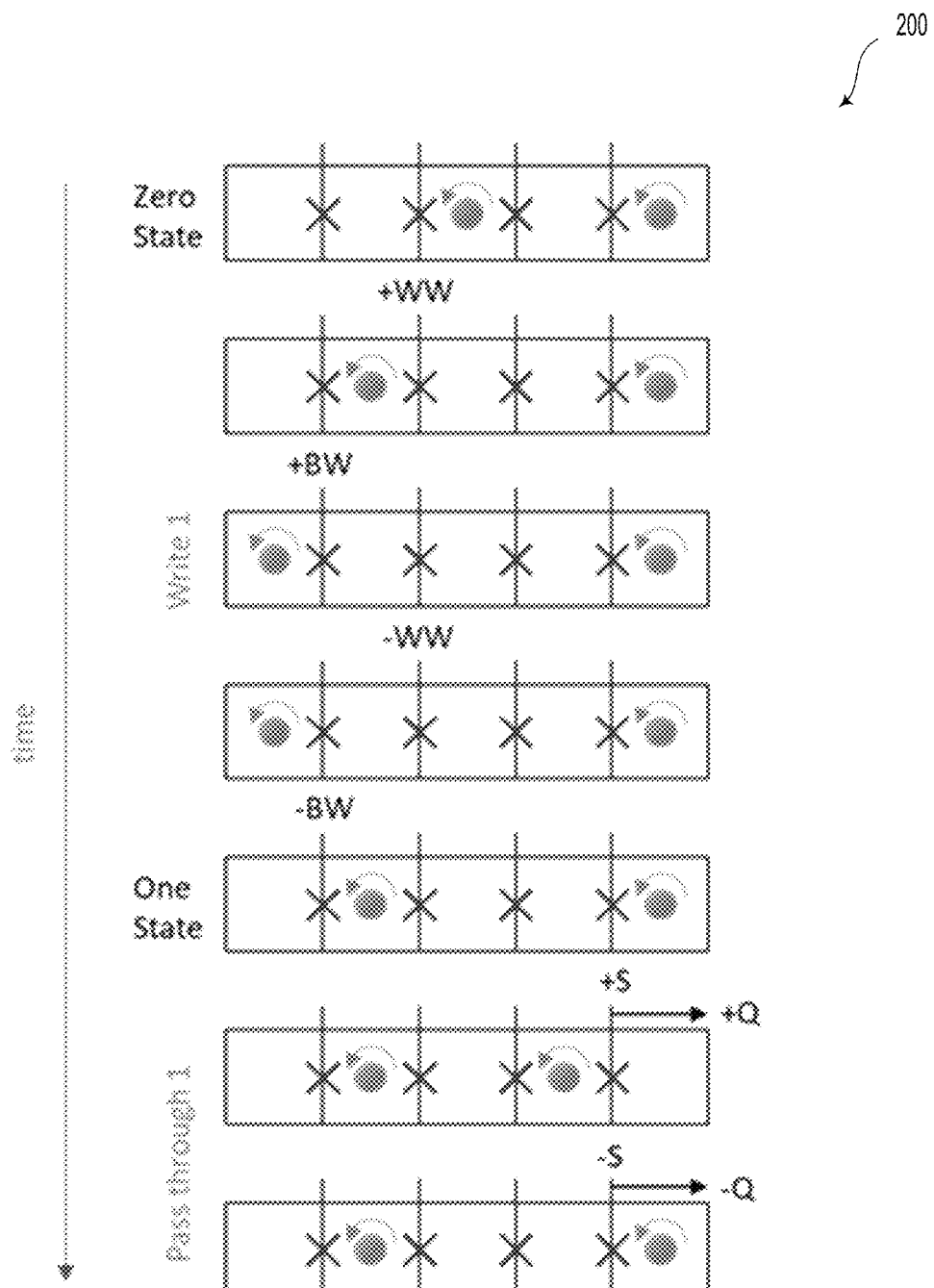
FIG. 2A illustrates a write path sequence from the zero state to the one state utilizing the Josephson junction based memory device of FIG. 1, in accordance with example embodiments.

FIG. 2A illustrates a write path sequence 200 from the zero state to the one state utilizing the Josephson junction based memory device 100 of FIG. 1, in accordance with example embodiments. Specifically, write path sequence 200 shows the input SFQ pulse sequence needed to move from the zero state (e.g., SFQ stored in a third superconducting loop 102c) to the one state (e.g., SFQ stored in a second superconducting loop 102b).

From the initial zero state with a SFQ (e.g., SFQ 140a) in a third superconducting loop (e.g., superconducting loop 102c), a positive signal current on the word write control line (e.g., word write control line 162) may act to shift the SFQ to the second superconducting loop (e.g., superconducting loop 102b).

In other words, a magnetic flux quanta (e.g., SFQ 140a) stored in an initial superconducting loop can be shifted to an adjacent loop (e.g., superconducting loop 102b) in a first direction (e.g., left) along the series arrangement in response to a positive SFQ pulse polarity provided on the word write control line 162. Conversely, the magnetic flux quanta may be shifted from a superconducting loop (e.g., superconducting loop 102b) to an adjacent loop (e.g., superconducting loop 102c) in a second direction (e.g., right) along the series arrangement in response to a negative SFQ pulse polarity provided on the word write control line 162. It will be understood that the principle of shifting magnetic flux quanta by using SFQ pulses via control lines can be applied more generally to shift magnetic flux between any of the adjacent superconducting loops.

Figure 2B:
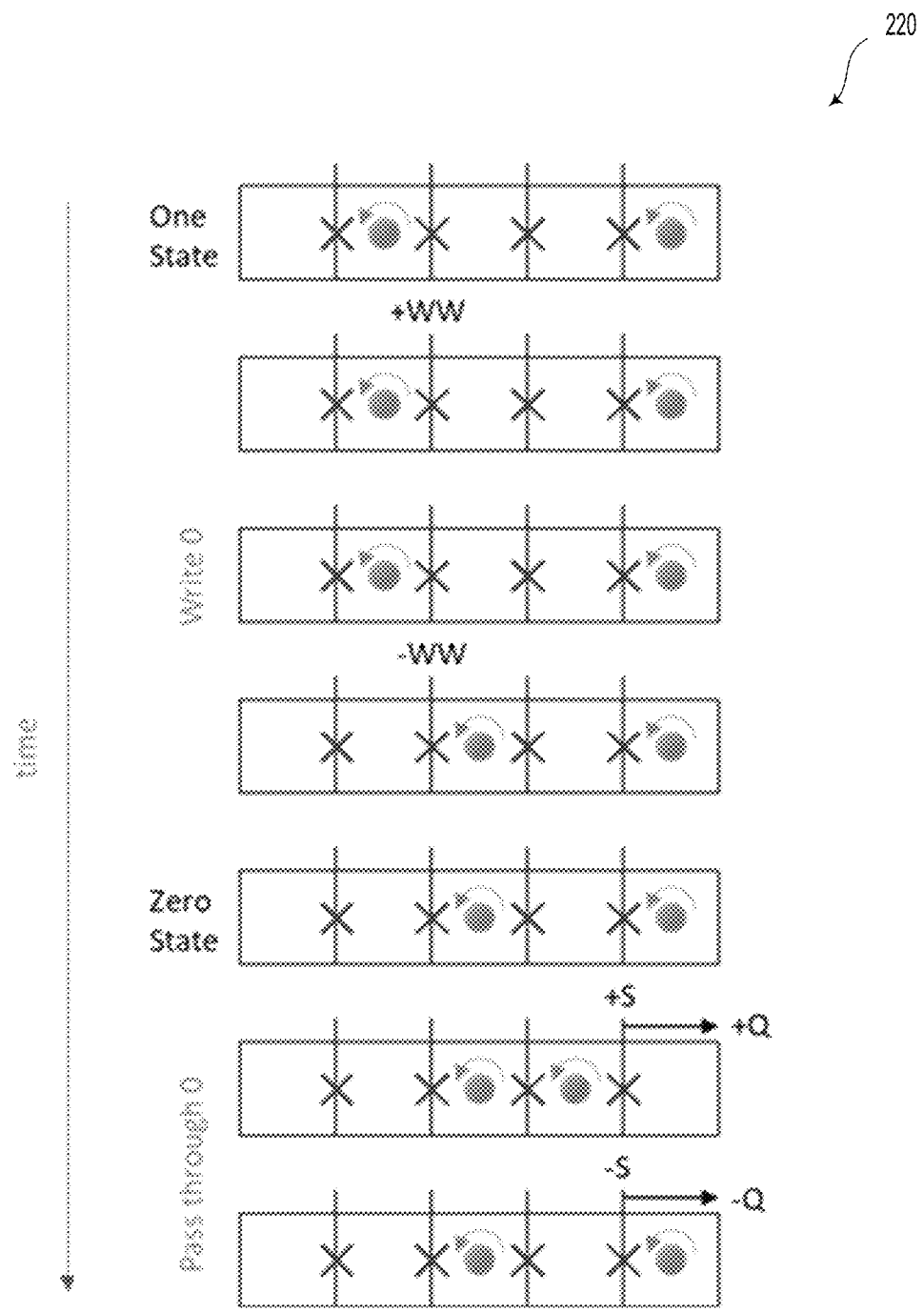
FIG. 2B illustrates a write path sequence from the one state to the zero state utilizing the Josephson junction based memory device of FIG. 1, in accordance with example embodiments.

FIG. 2B illustrates a write path sequence 220 from the one state to the zero state utilizing the Josephson junction based memory device 100 of FIG. 1, in accordance with example embodiments. Specifically, write path sequence 220 shows the input SFQ pulse sequence needed to move from the one state (e.g., SFQ stored in a second superconducting loop 102b) to the zero state (e.g., SFQ stored in a third superconducting loop 102c).

Figure 3A:
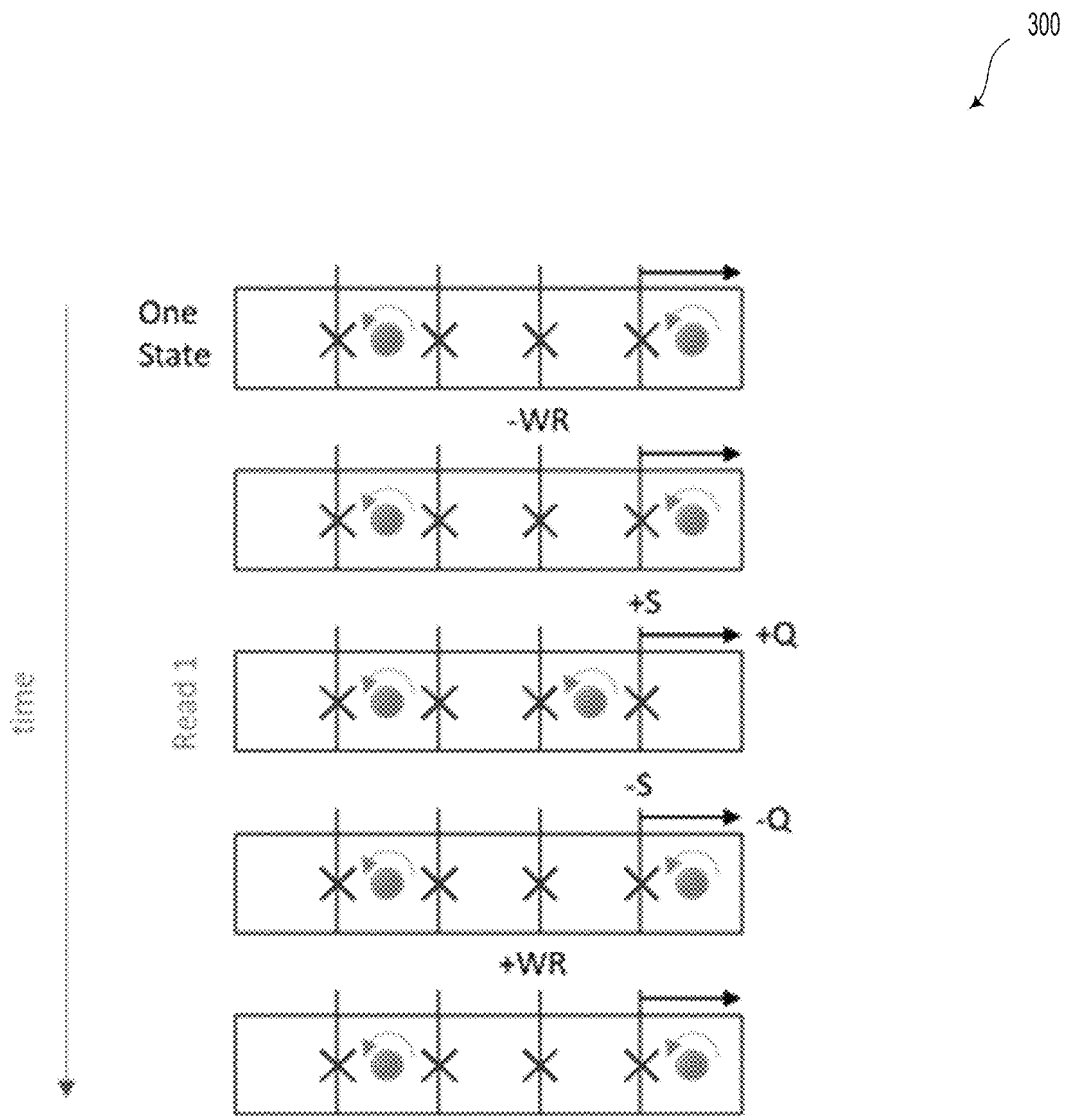
FIG. 3A illustrates a read path sequence for reading a one state utilizing the Josephson junction based memory device of FIG. 1, in accordance with example embodiments.
Figure 3B:
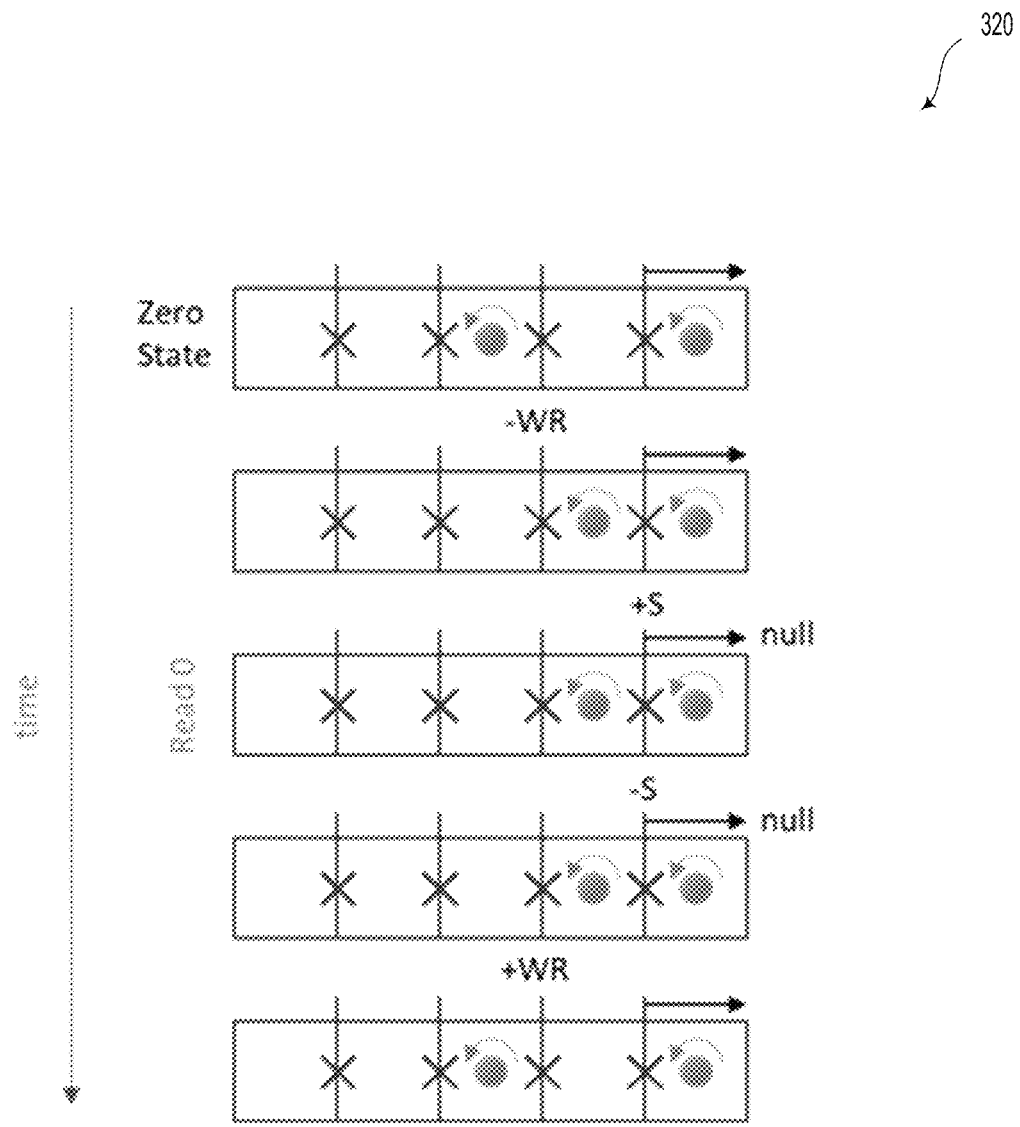
FIG. 3B illustrates a read path sequence for reading a zero state utilizing the Josephson junction based memory device of FIG. 1, in accordance with example embodiments.

A detailed description of the read path for the memory device 100 is shown in FIGS. 3A and 3B. The design requires two clock cycles to complete a read operation, but a parallel write operation to a different cell during the second cycle may be additionally performed.

In an example embodiment, the memory device 100 could provide and receive read control signals by way of the plurality of address lines to at least a portion of the plurality of superconducting loops 102. In an example embodiment, the read control signals include word read, strobe, and output. The read path sequence of control signals is provided below.

FIG. 3A illustrates a read path sequence 300 for reading a one state utilizing the Josephson junction based memory device 100 of FIG. 1, in accordance with example embodiments. Read path sequence 300 provides the Josephson junction switching sequence when reading a one state. As with write operations, the operating principle involves addition of currents in the Josephson junctions (e.g., Josephson junctions 104a, 104b, 104c, and 104d): the SFQ will move one superconducting loop to the left if a positive signal current adds constructively to the stored SFQ, which is a persistent current in the loop. The SFQ will move one superconducting loop to the right if a negative signal current adds to negative current in the stored SFQ. The currents of SFQ stored in adjacent loops cancel in the shared JJ, so that two SFQ do not occupy a shared loop at the same time. The Q output is generated only if the S junction switches and moves the stored pulse between loops. The control signals for the read operation are Word Read (WR), Strobe (S), and output (Q) with polarity indicated by (+) or (−). Note that WR events must enclose S events. For AC-powered Josephson junctions where positive and negative pulses must occur in opposite halves of the clock cycle, this means that the pair of S events can complete within a clock cycle, but that a pair of WR events requires two clock cycles.

FIG. 3B illustrates a read path sequence 320 for reading a zero state utilizing the Josephson junction based memory device 100 of FIG. 1, in accordance with example embodiments. Read path sequence 320 provides the Josephson junction switching sequence when reading a zero state.

Figure 4:
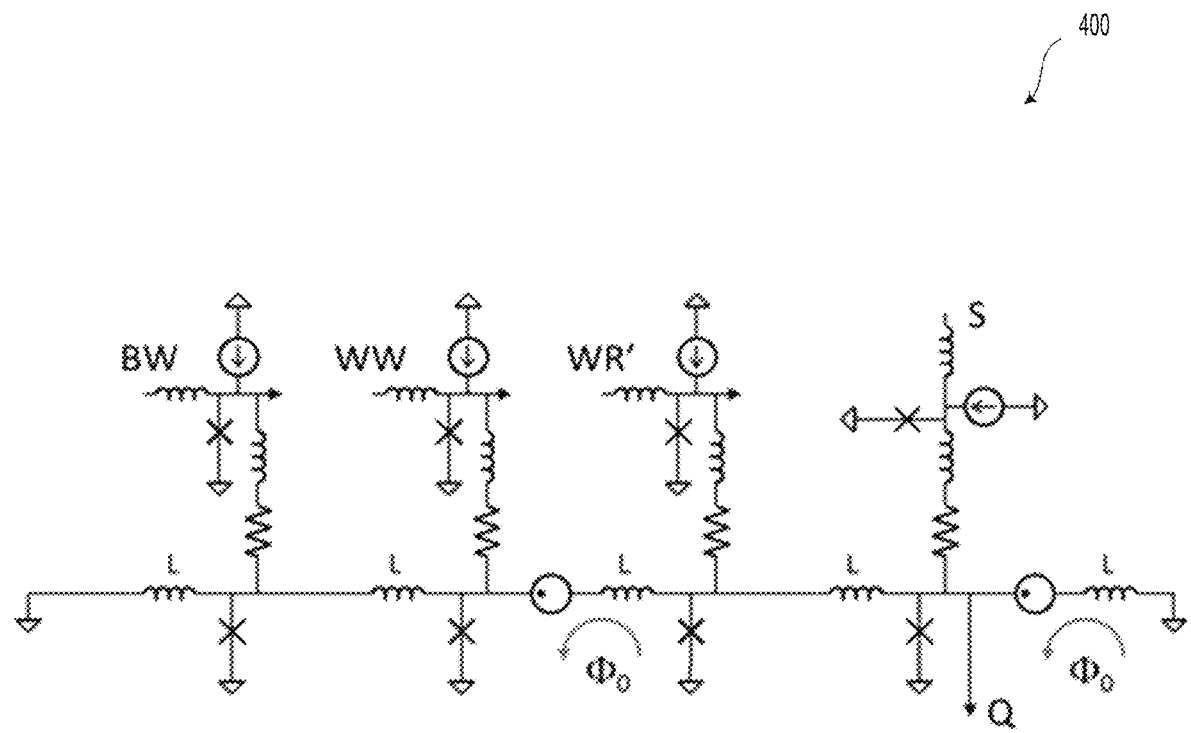
FIG. 4 illustrates a circuit diagram of the Josephson junction based memory device of FIG. 1, in accordance with example embodiments.

FIG. 4 illustrates a circuit diagram 400 of the Josephson junction based memory device 100 of FIG. 1, in accordance with example embodiments. The circuit diagram 400 consists of standard Josephson transmission line (JTL) stages along the address lines. The current sources (with arrows) represent AC bias, which allows both positive and negative SFQ pulses to propagate at different times in the clock cycle. Resistors couple the inputs to the internals of the cell. Each junction-resistor pair is a decision-making element; if the signal current adds with the same polarity to the current of the SFQ in a storage loop as seen by the junction, the signal will trigger the junction to produce an SFQ pulse and move the stored pulse to the adjacent storage loop. Otherwise, the signal voltage will be lost across the resistor. Note that similar behavior could be achieved by replacing any or all of these coupling resistors with additional Josephson junctions. The pulsed voltage sources (with dots) represent SFQ sources to produce the initial state. The initial state shown corresponds to the zero state, but other initial states could be used. Finally, the current sources represent the ac bias supplied by the global resonant clock network on-chip. Phasing of the bias sources is provided to be consistent with the desired SFQ pulse timing.

In use, setting the initial state does not need to use pulsed voltage sources. Real physical implementations use magnetic coupling provided by way of a control line. Various methods are shown in FIGS. 5A, 5B, and 5C, which may help to decrease the physical size of the control line and increase the accuracy of the initial state.

Figure 5A:
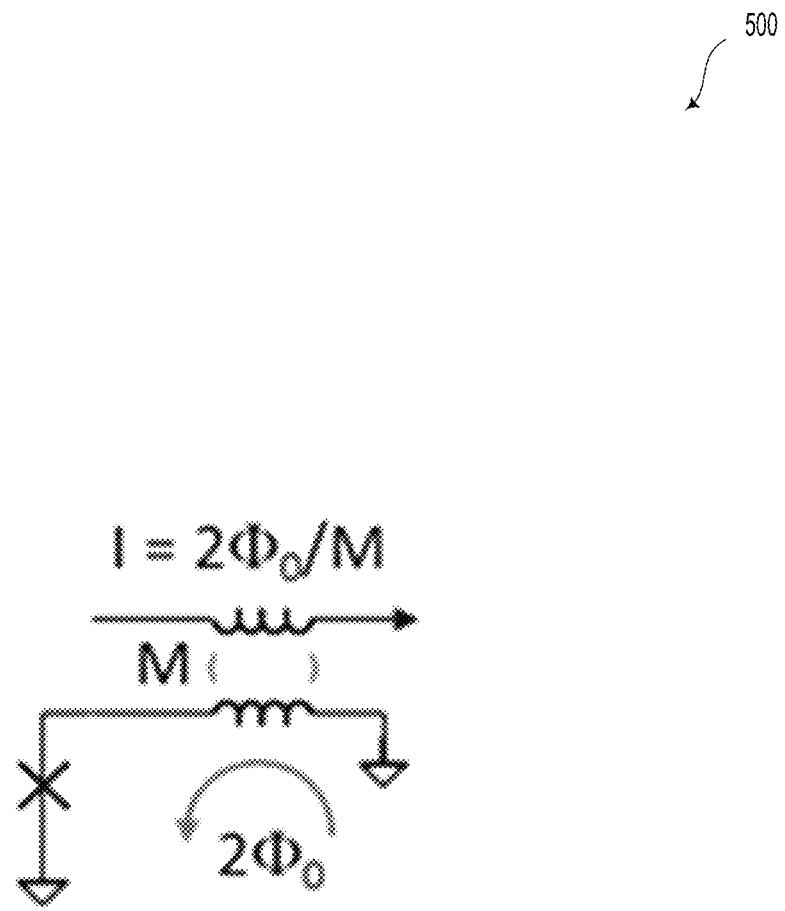
FIG. 5A illustrates a flux initialization process, in accordance with example embodiments.

FIG. 5A illustrates a flux initialization process 500, in accordance with example embodiments. In an example embodiment, both SFQs may be initialized into the rightmost loop of the unit cell so that there is only a single transformer. The current required in the primary depends on the desired flux and the mutual inductance M according to:

$$I_{primary} = \frac{2\Phi_0}{M}.$$

Figure 5B:
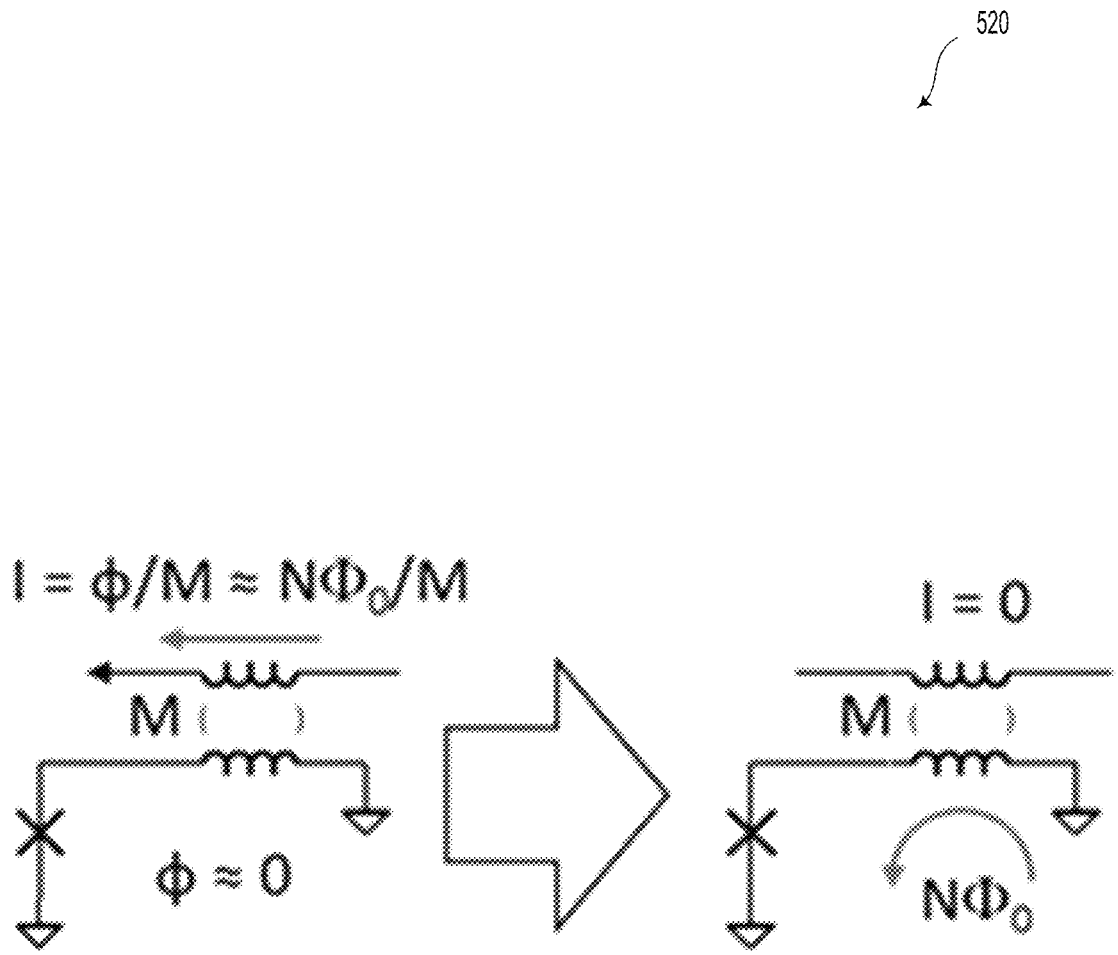
FIG. 5B illustrates a flux initialization process, in accordance with example embodiments.
Figure 5C:
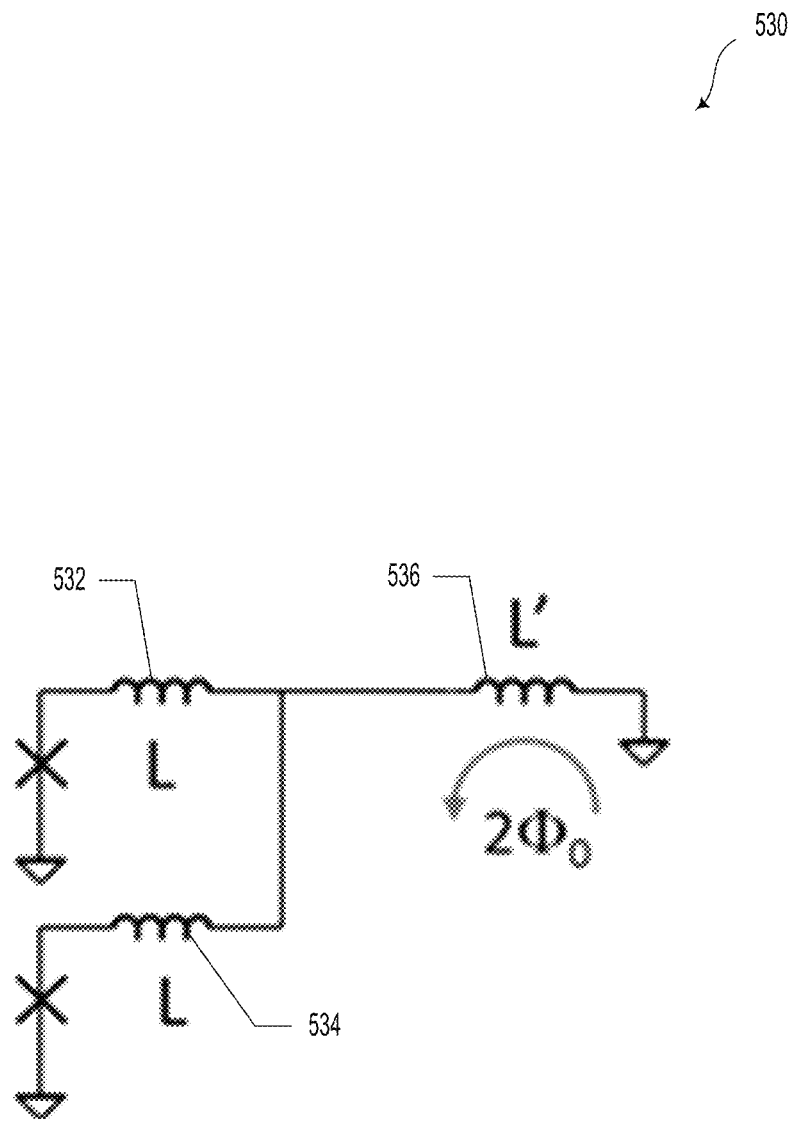
FIG. 5C illustrates multiple unit cells sharing the same flux source, in accordance with example embodiments.

FIG. 5B illustrates a flux initialization process 520, in accordance with example embodiments. As an alternative to flux initialization process 500, the flux may be initialized in a two-step flux initialization process 520. In a first step, a current of opposite polarity is applied in the primary during a cooldown process before the secondary loop has reached the superconducting critical temperature. During such a scenario, the secondary loop finds the lowest-energy state where the stored flux is ideally zero, but with magnitude not to exceed half an SFQ. In a second step of flux initialization process 520, once the secondary loop has reached a superconducting critical temperature, the control current is turned off and an exact integer number N of SFQ becomes set up in the loop, with the number of SFQs being determined by the initial current in the primary according to:

$$I_{primary} = \frac{\Phi}{M} \approx \frac{N\Phi_0}{M}.$$

Put another way, the memory device 100 may include at least one magnetically coupled control line. In such scenarios, the plurality of superconducting loops 102 are configured to provide an initial flux state in response to a two-step flux initialization process. The two-step flux initialization process includes: 1) while cooling down the Josephson junction based memory device, providing an initialization signal via the at least one magnetically coupled control line; and 2) upon reaching a superconducting critical temperature of the Josephson junction based memory device, turning off the initialization signal such that an exact integral number of SFQ are stored in one or more of the superconducting loops.

FIG. 5C illustrates a scenario 530 in which multiple unit cells (e.g., respective unit cells associated with inductor 532 and inductor 534) share the same flux source (e.g., flux source 536), in accordance with example embodiments. In some embodiments, the mutual inductance L' shared by the loops is much less than the total inductance L of each loop. In such scenarios, a low L' inductance achieves good isolation by approximating a low-impedance source.

Figure 6:
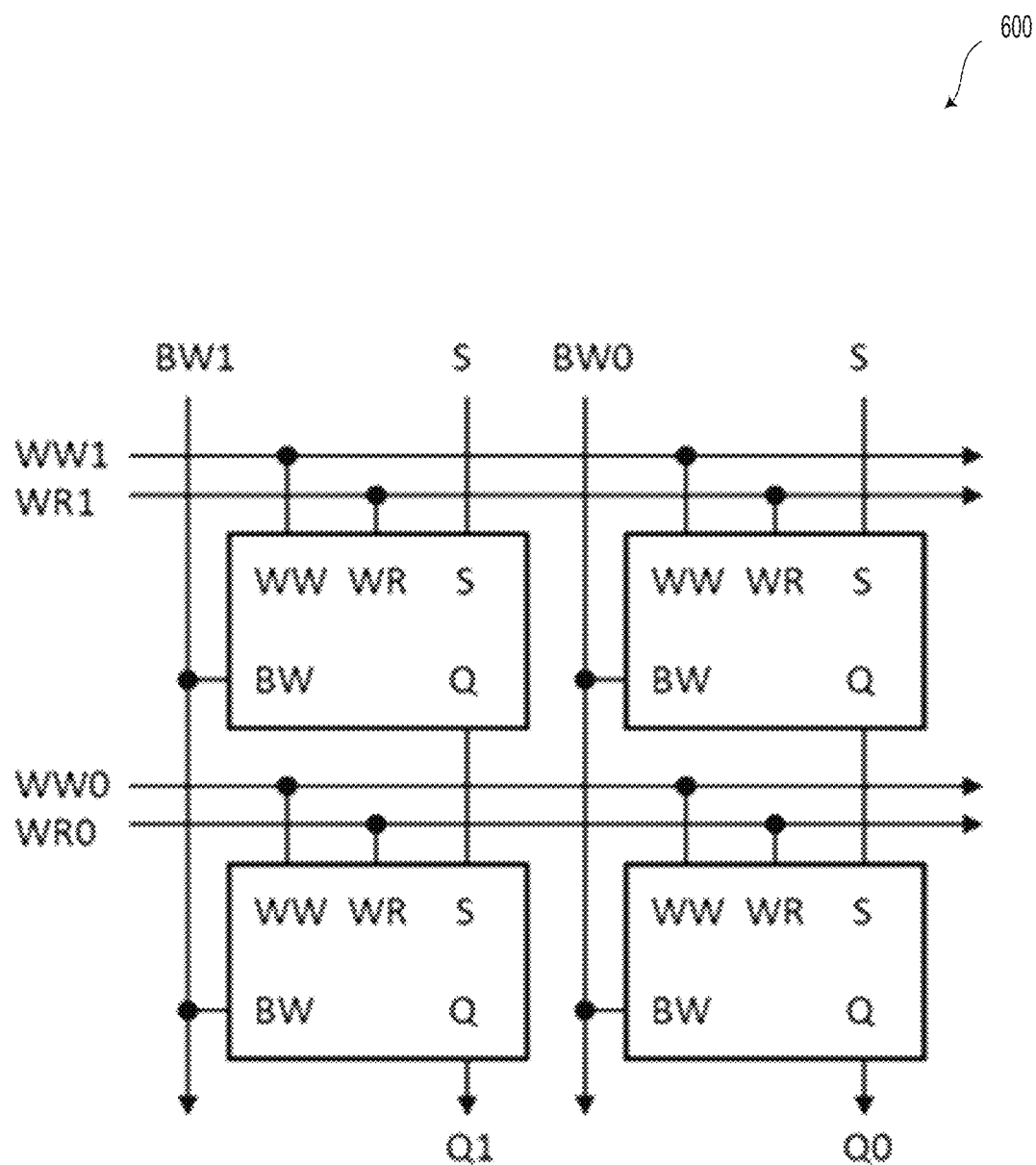
FIG. 6 illustrates an array of unit cells arranged in a word-organized memory fabric, in accordance with example embodiments.

FIG. 6 illustrates an array of unit cells arranged in a word-organized memory fabric 600, in accordance with example embodiments. Because the address lines use Josephson Transmission Lines (JTLs), the memory fabric is wave-pipelined, and multiple operations can be in flight at once. It is not allowed to read and write to the same word in the same clock cycle, but simultaneous read and write to different words is allowed. As illustrated in FIG. 6, the unit cells may be arrayed to produce a word-organized memory fabric. The address lines use JTLs that fan-out the signals to all cells in a vine configuration.

Put another way, the series arrangement (e.g., Josephson junction based memory device 100) could be considered a unit cell. An array of coupled unit cells could form a memory fabric, which can be wave-pipelined. In such scenarios, multiple operations can be carried out simultaneously across the memory fabric. In various embodiments, the unit cells of the memory fabric 600 are coupled to a global resonant clock network (e.g., global resonant clock network 170).

Figure 7:
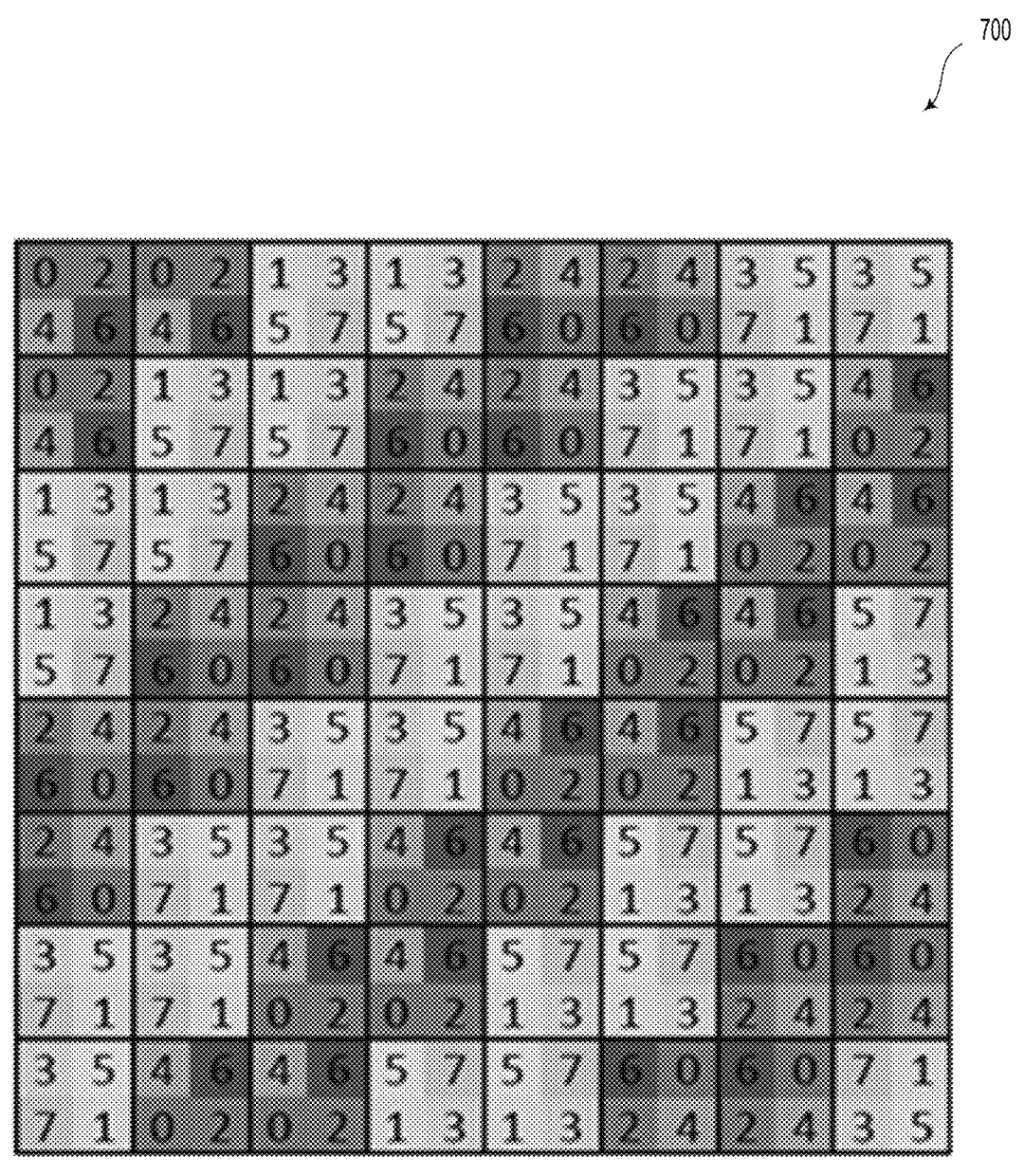

FIG. 7 illustrates a wave-pipelining arrangement 700 of the array of unit cells, in accordance with example embodiments. Wave-pipelining through the array means that the phasing of the AC bias sources will advance with signal latency. In this way, multiple operations may be in flight simultaneously, achieving throughput at the native clock frequency of the logic.

Advancing the phase of the AC bias enables wave-pipelining of the array. FIG. 7 supposes that a local group of unit cells requires four of eight clock phases (e.g. 0, 2, 4, and 6) and that these phases precess from top-left to bottom-right. This is consistent with the signal propagation from top-left to bottom-right along Manhattan-geometry paths.

Figure 8:
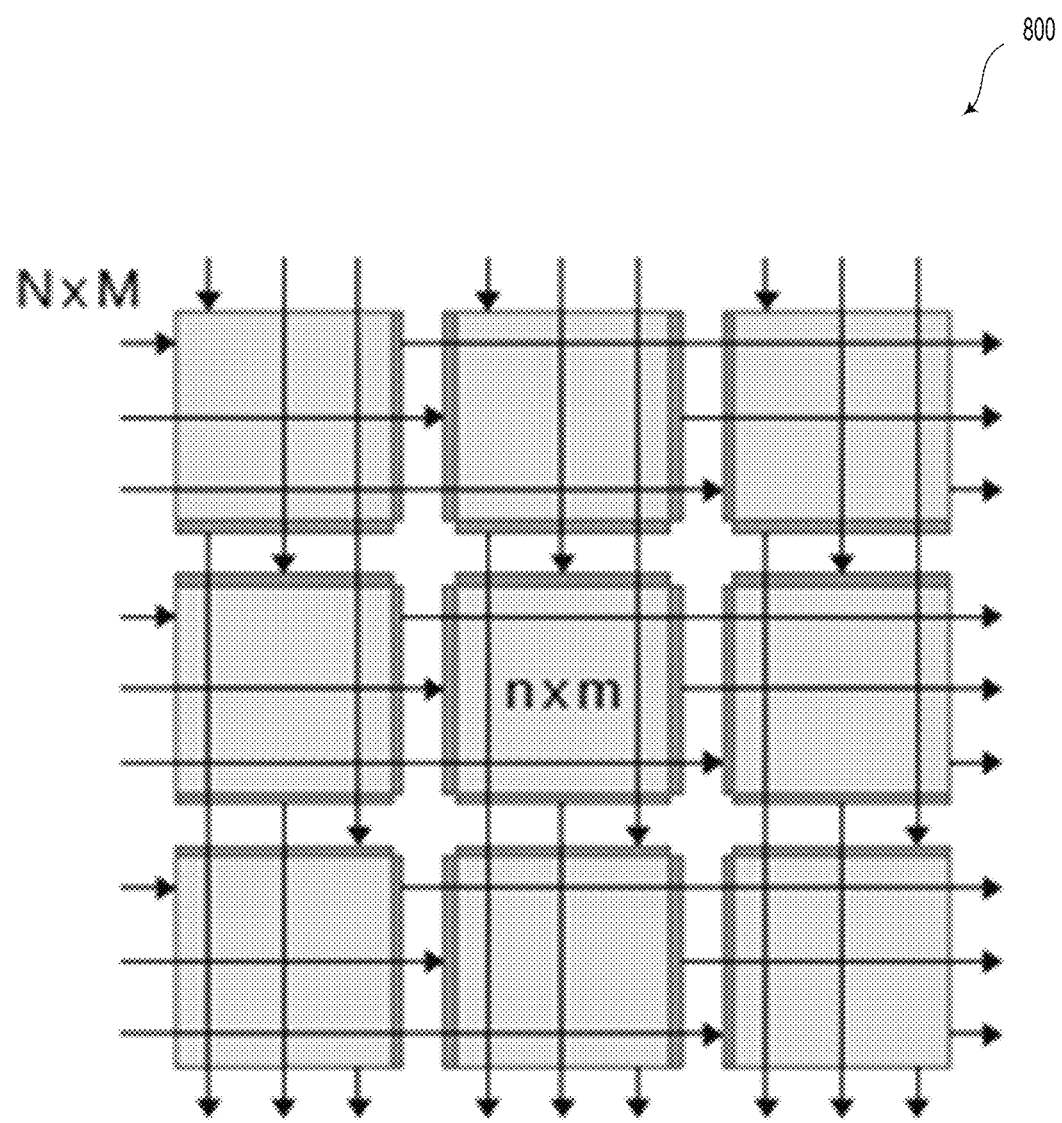
FIG. 8 illustrates an arrangement of partitioned subarrays, in accordance with example embodiments.

FIG. 8 illustrates an arrangement 800 of partitioned subarrays, in accordance with example embodiments. In some embodiments, partitioning the array of unit cells into smaller active subarrays interconnected with passive transmission lines (black lines with arrows) can improve latency and improve power dissipation, as high activity factor of the junctions during a read or write operation is restricted to the subarray.

Figure 9A:
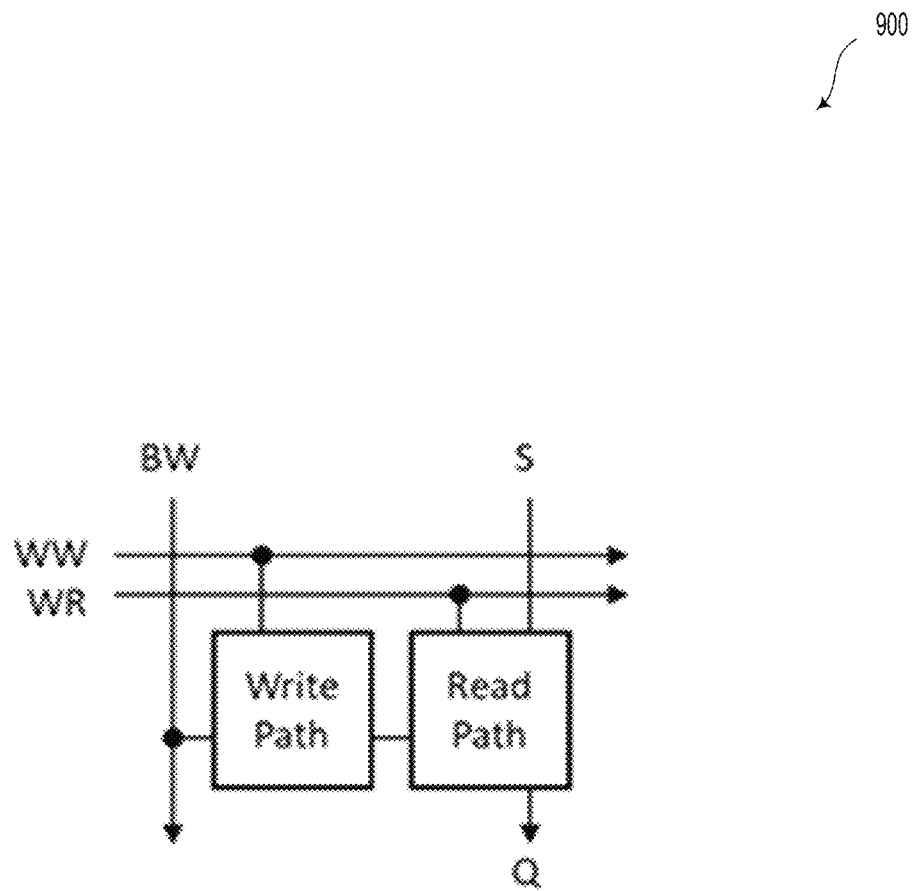
FIG. 9A illustrates a partitioned unit cell with separate write path and read path, in accordance with example embodiments.

As described elsewhere herein, the design generalizes to multiple read ports and multiple write ports. Any number of read and write ports can be incorporated into a single design by extension of this methodology. FIG. 9A illustrates a partitioned unit cell 900 with separate write path and read path, in accordance with example embodiments.

Figure 9B:
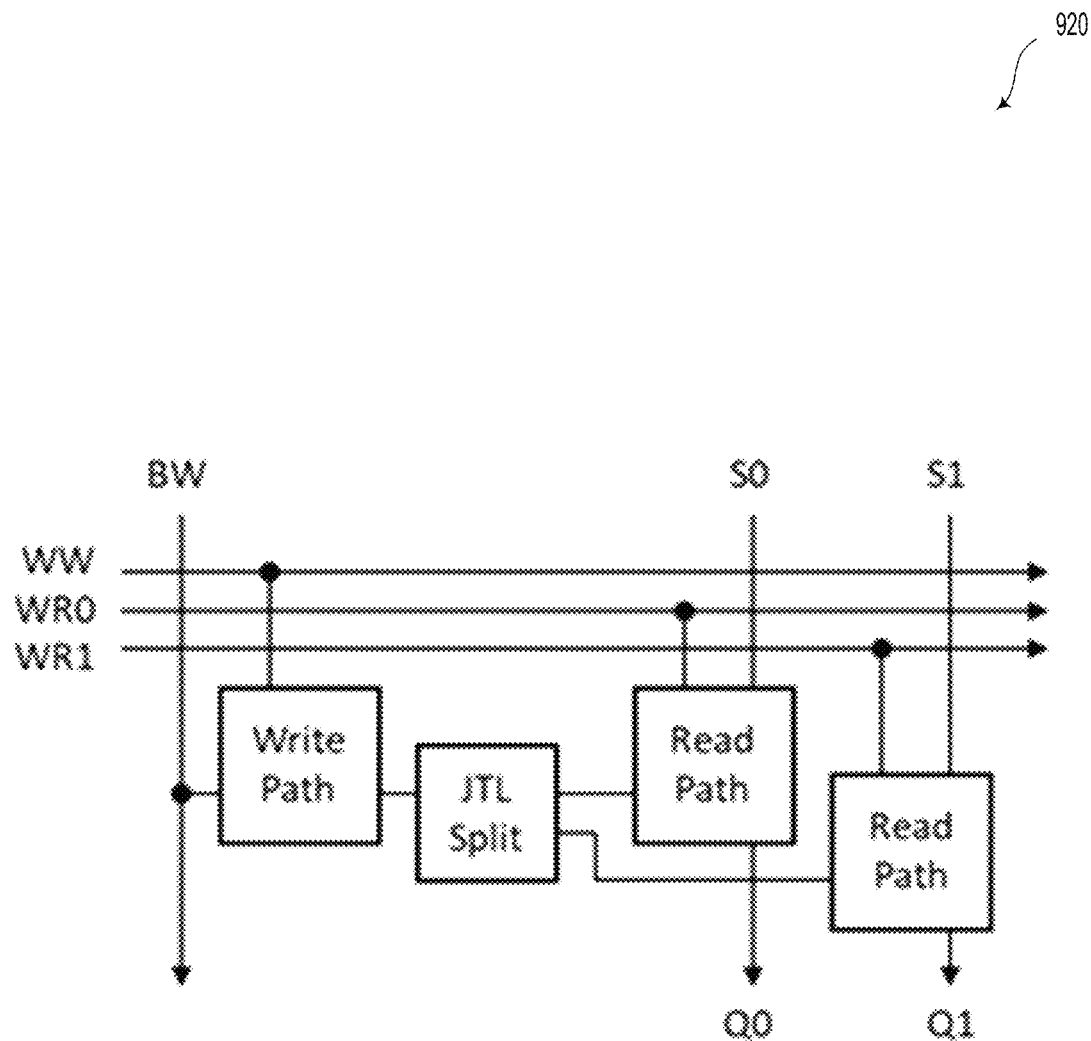
FIG. 9B illustrates a unit cell with duplicated read paths, in accordance with example embodiments.

FIG. 9B illustrates a partitioned unit cell 920 with duplicated read paths, in accordance with example embodiments. In such scenarios, the read path is duplicated to make two read ports. Specifically, the stored SFQ associated with the write path can be communicated to the read path through a Josephson junction transmission line splitter network that provides isolation and gain.

Figure 9C:
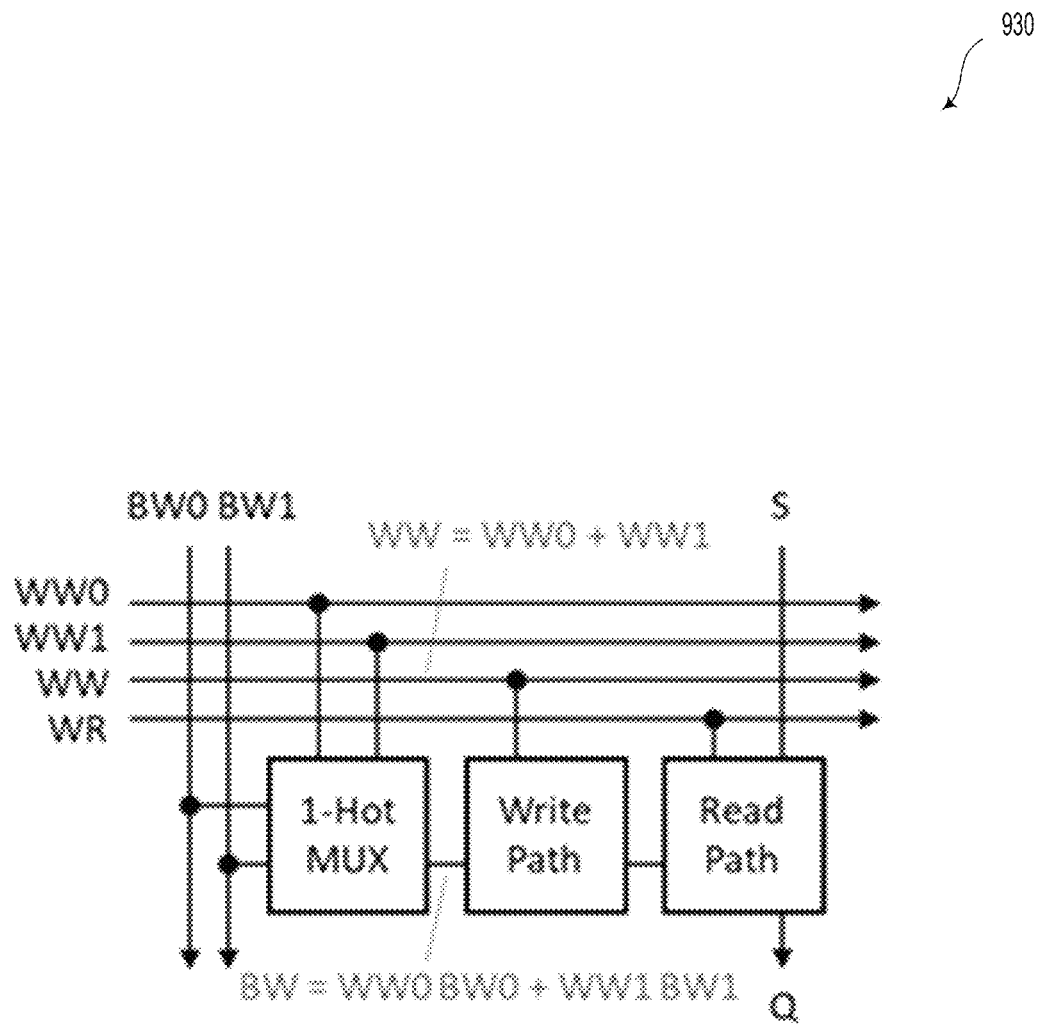
FIG. 9C illustrates a unit cell with duplicated write paths, in accordance with example embodiments.

FIG. 9C illustrates a partitioned unit cell 930 with duplicated write paths, in accordance with example embodiments. The write path is duplicated using a one-hot multiplexor (MUX) that produces the signal BW with the logic function shown. The MUX can be built with two AND gates followed by an OR gate. Alternately the MUX can be two A-AND-NOT-B gates followed by an OR gate, with the inverted AND inputs fed with inverted BW data. In such scenarios, the array is also fed with the signal WW with the OR logic function shown.

Example Alternative Josephson Junction Based Memory Devices

Figure 10:
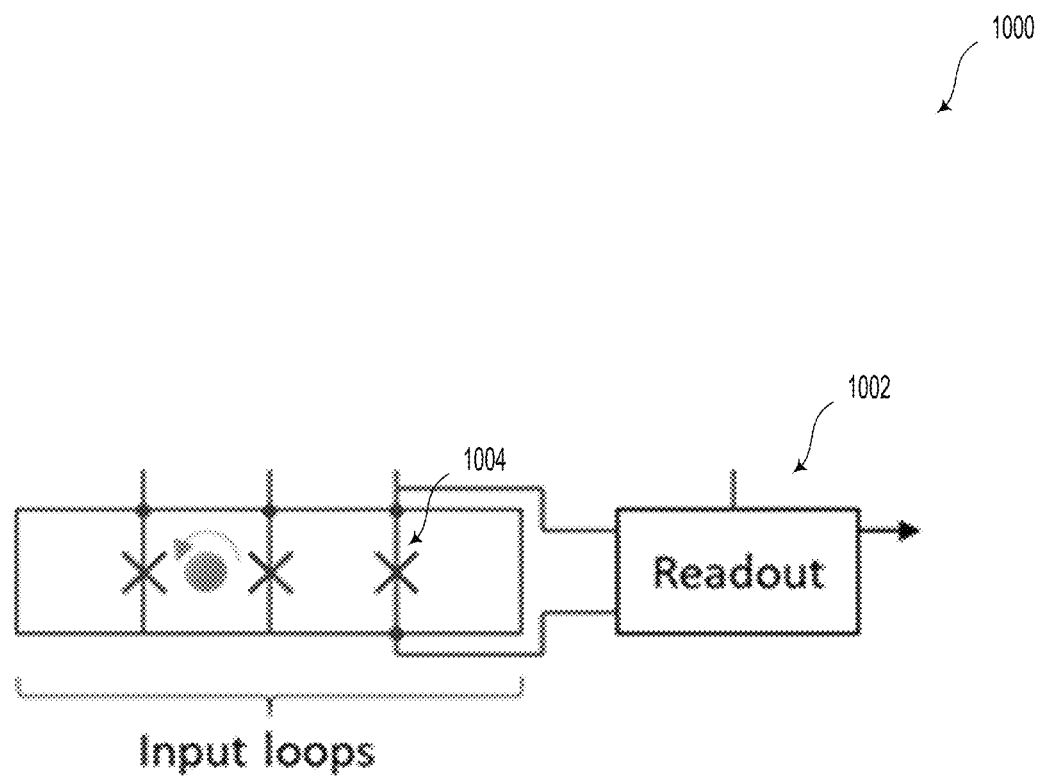
FIG. 10 illustrates a schematic diagram of an alternative Josephson junction based memory device, in accordance with example embodiments.

FIG. 10 illustrates a schematic diagram of an alternative Josephson junction based memory device 1000, in accordance with example embodiments. In such scenarios, the series arrangement may include four superconducting loops, of which all are input loops. The alternative memory device 1000 could include a readout stage 1002. The readout stage 1002 could be coupled to a Josephson junction 1004 shared by two of the input loops. In such examples, the readout stage 1002 is configured to detect whether an SFQ is stored in a specific one of the input loops. In the alternative memory device 1000, the readout stage is connected to the rightmost junction of the input loops, and detects whether the stored pulse is in the rightmost loop during read operations. One potential advantage of the design of the alternative memory device 1000 is that it supports single-cycle reads, as illustrated and described in FIGS. 11A and 11B.

Figure 11A:
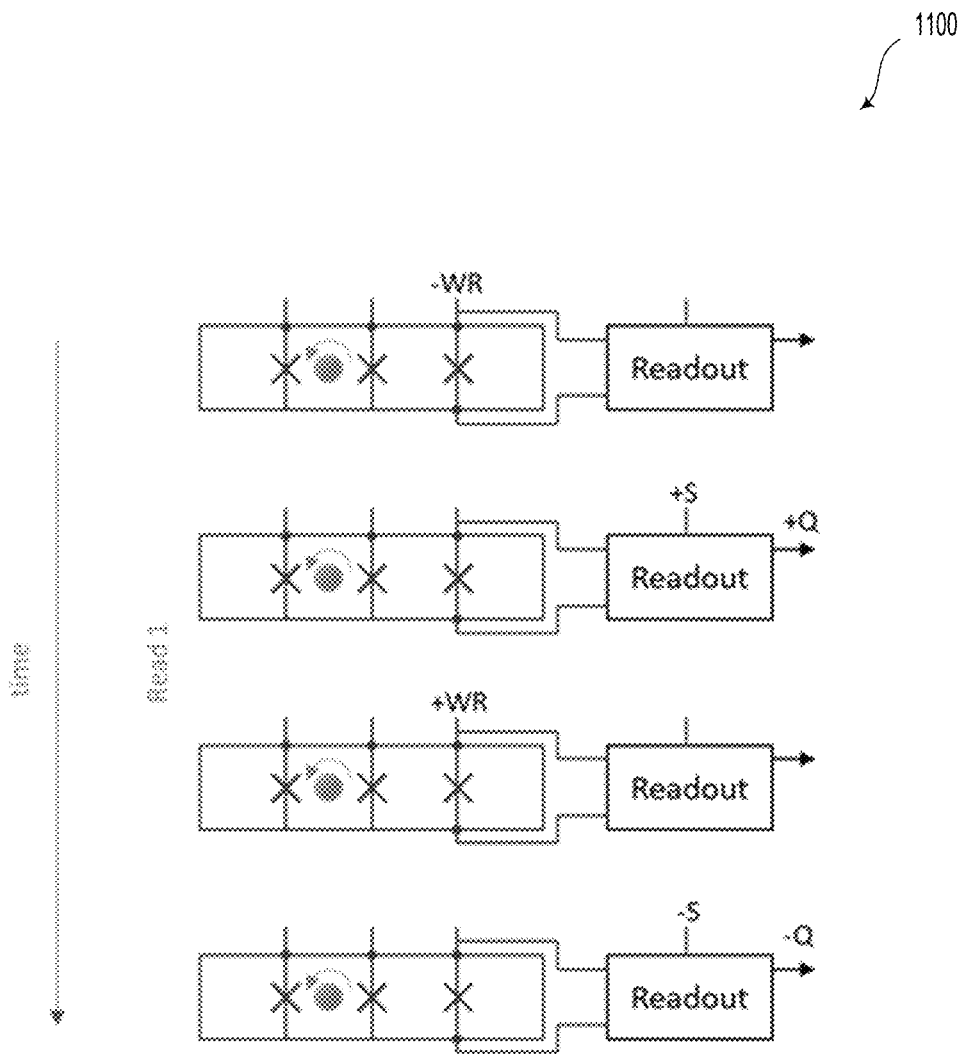
FIG. 11A illustrates a read path sequence for reading a one state utilizing the alternative Josephson junction based memory device of FIG. 10, in accordance with example embodiments.

FIG. 11A illustrates a read path sequence 1100 for reading a one state utilizing the alternative Josephson junction based memory device 1000 of FIG. 10, in accordance with example embodiments. The S input produces the Q output unless the stored pulse is in the rightmost loop. The pair of WR events and the pair of S events can all complete within a clock cycle, in contrast to the design of memory device 100.

Figure 11B:
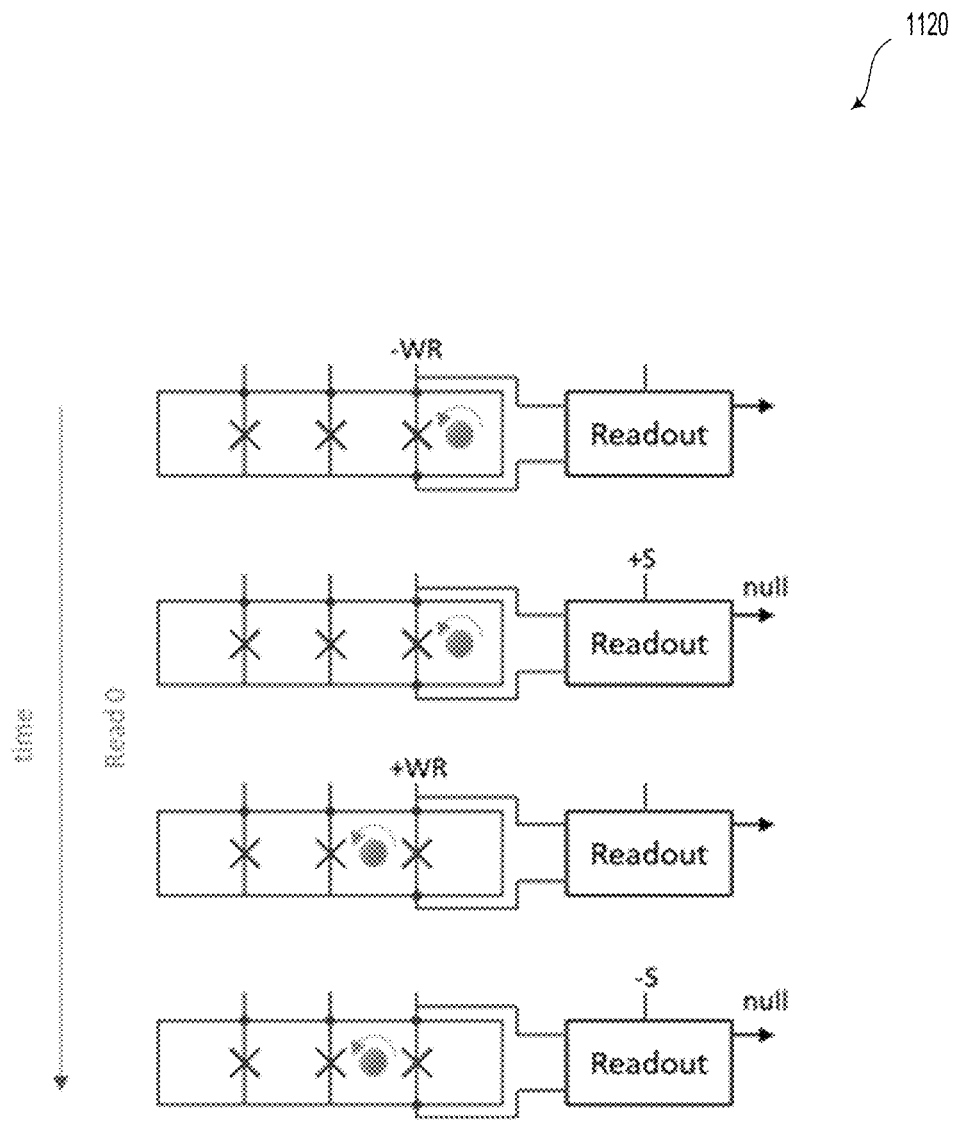
FIG. 11B illustrates a read path sequence for reading a zero state utilizing the alternative Josephson junction based memory device of FIG. 10, in accordance with example embodiments.

FIG. 11B illustrates a read path sequence 1120 for reading a zero state utilizing the alternative Josephson junction based memory device 1000 of FIG. 10, in accordance with example embodiments.

Figure 12A:
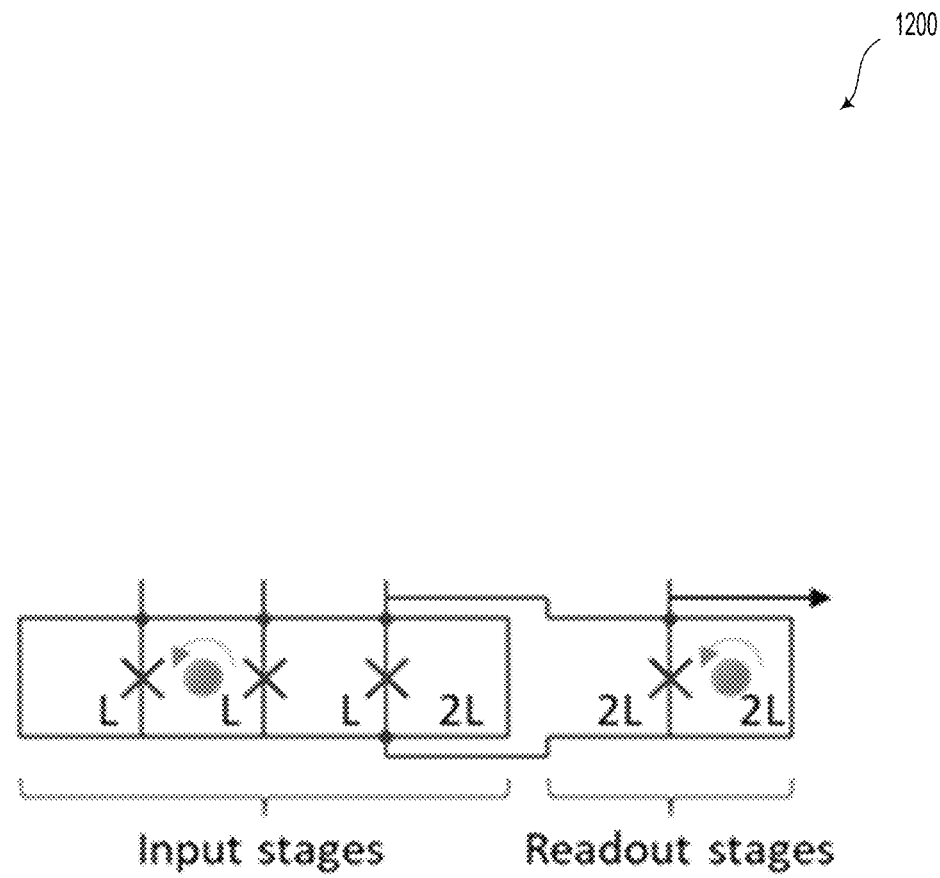
FIG. 12A illustrates a first read path variation utilizing the alternative Josephson junction based memory device of FIG. 10, in accordance with example embodiments.
Figure 12B:
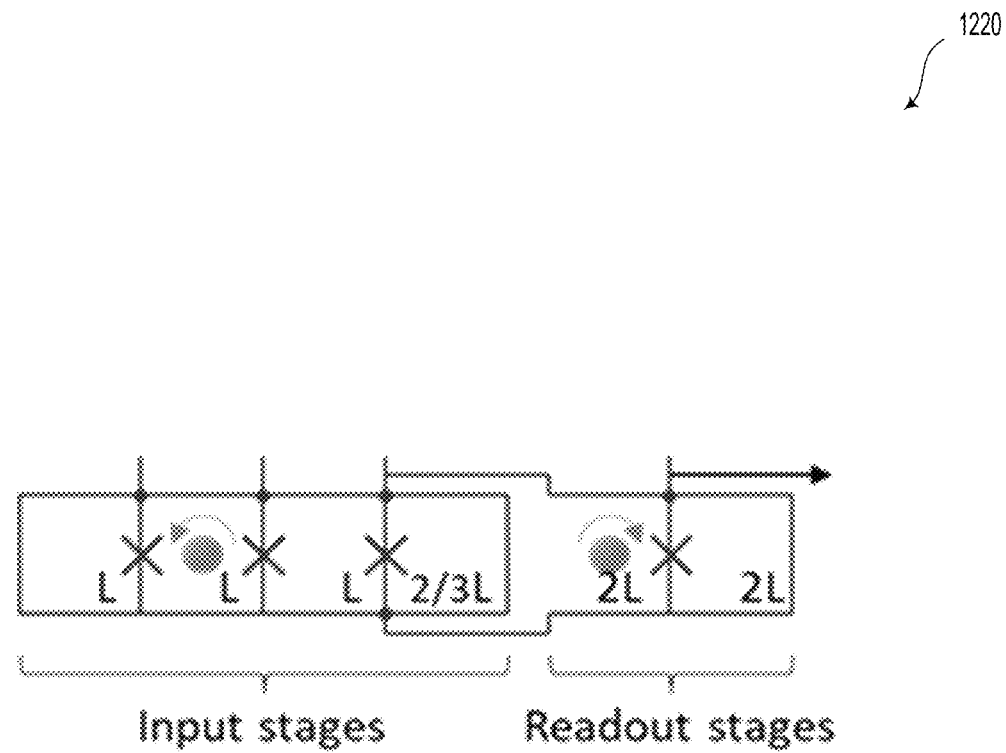
FIG. 12B illustrates a second read path variation utilizing the alternative Josephson junction based memory device of FIG. 10, in accordance with example embodiments.
Figure 12C:
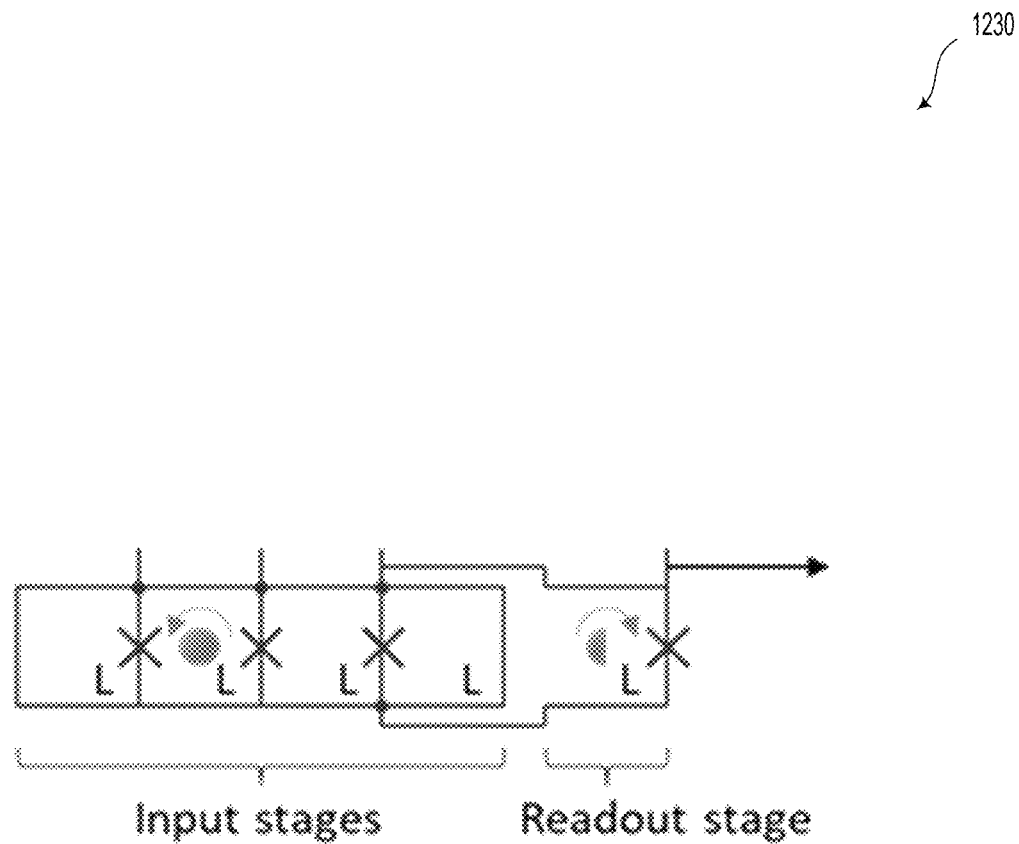
FIG. 12C illustrates a third read path variation utilizing the alternative Josephson junction based memory device of FIG. 10, in accordance with example embodiments.

Three functionally equivalent read paths conforming to the second design (e.g., alternative memory device 1000) are shown in FIGS. 12A, 12B, and 12C. It will be understood that while three alternative read path variations are described, other alternatives are possible and contemplated.

FIG. 12A illustrates a first read path variation 1200 utilizing the alternative Josephson junction based memory device 1000 of FIG. 10, in accordance with example embodiments. Relative inductance of the different loops is shown. Approximate inductor values are shown for illustration, neglecting second-order effects such as JJ inductance and leakage between loops.

FIG. 12B illustrates a second read path variation 1220 utilizing the alternative Josephson junction based memory device 1000 of FIG. 10, in accordance with example embodiments. Relative inductance of the different loops is shown. Approximate inductor values are shown for illustration, neglecting second-order effects such as JJ inductance and leakage between loops.

FIG. 12C illustrates a third read path variation 1230 utilizing the alternative Josephson junction based memory device 1000 of FIG. 10, in accordance with example embodiments. Relative inductance of the different loops is shown. Approximate inductor values are shown for illustration, neglecting second-order effects such as JJ inductance and leakage between loops. The read path sequences for the first, second, and third read path variations are provided in FIGS. 13A, 13B, 14A, 14B, 15A, and 15B.

Figure 13A:
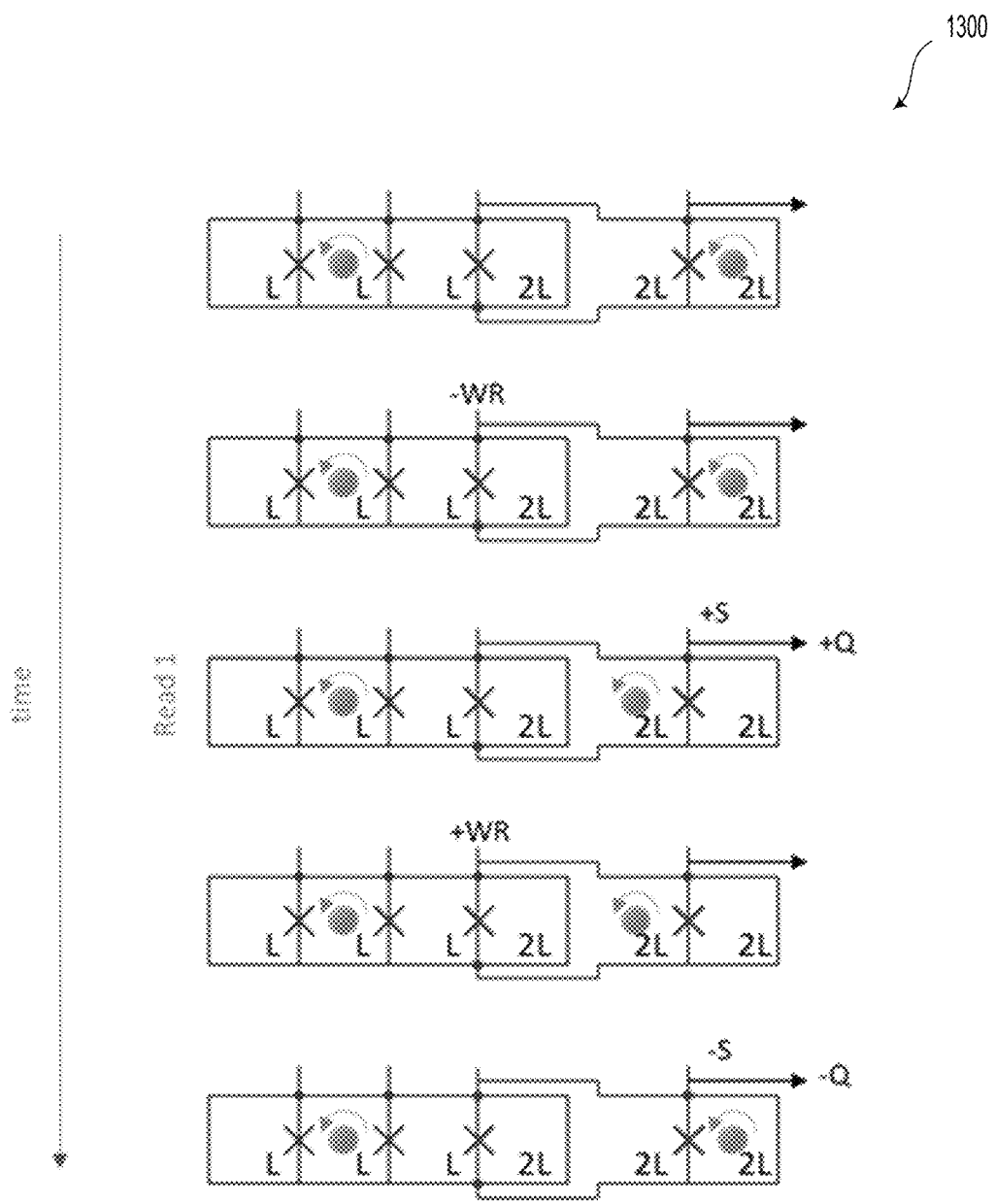
FIG. 13A illustrates a read path sequence for reading a one state utilizing the first read path variation of the alternative Josephson junction based memory device of FIG. 12A, in accordance with example embodiments.

FIG. 13A illustrates a read path sequence 1300 for reading a one state utilizing the first read path variation 1200 of the alternative Josephson junction based memory device 1000 of FIG. 12A, in accordance with example embodiments. In such a scenario, when reading a one, the leftmost '2L" loop prevents the +WR signal from migrating the output SFQ into the input loops.

Figure 13B:
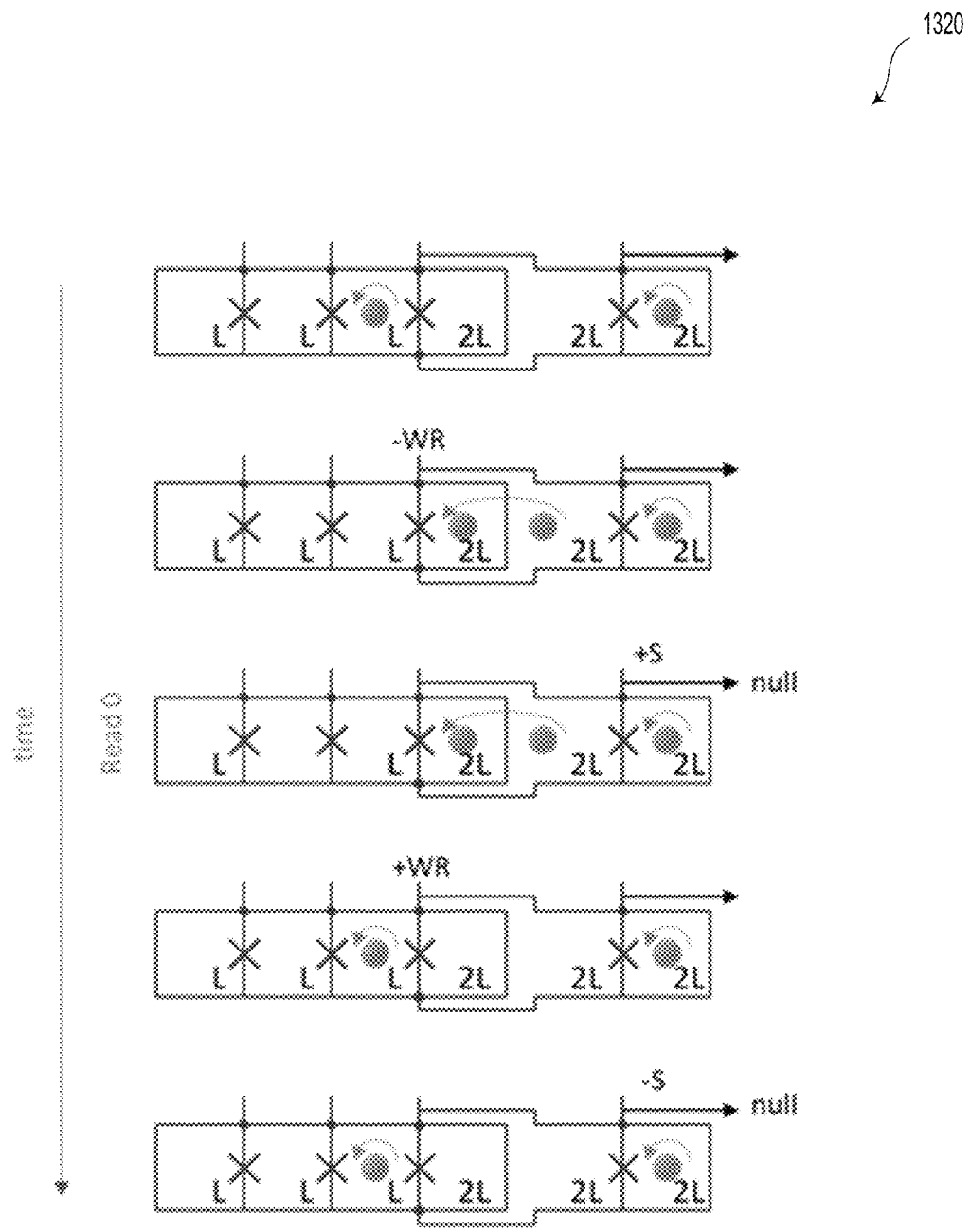
FIG. 13B illustrates a read path sequence for reading a zero state utilizing the first read path variation of the alternative Josephson junction based memory device of FIG. 12A, in accordance with example embodiments.

FIG. 13B illustrates a read path sequence 1320 for reading a zero state utilizing the first read path variation 1200 of the alternative Josephson junction based memory device 1000 of FIG. 12A, in accordance with example embodiments. In such embodiments, when reading a zero, the −WR signal moves the SFQ from the input stages into the two 2L loops.

Figure 14A:
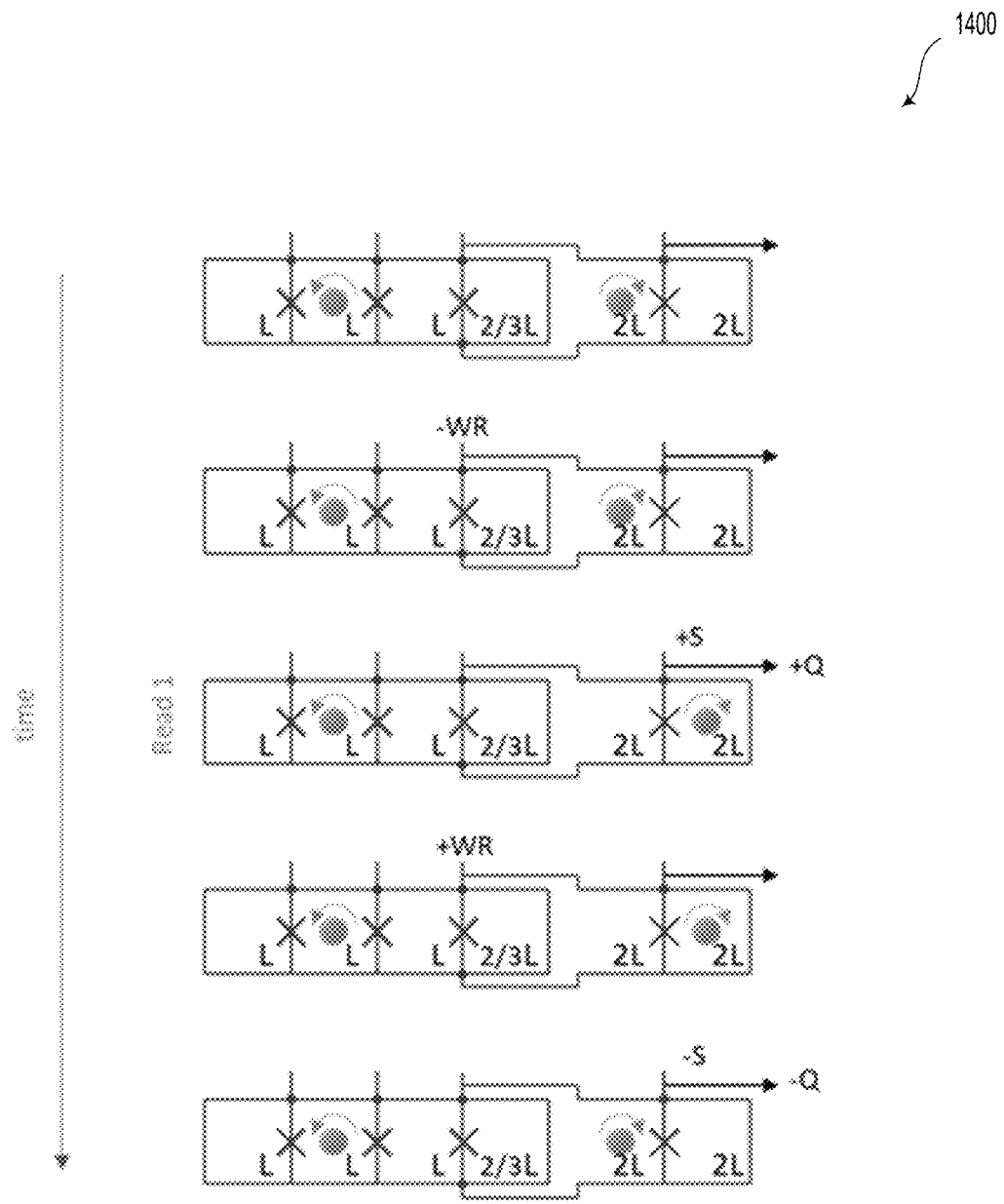
FIG. 14A illustrates a read path sequence for reading a one state utilizing the second read path variation of the alternative Josephson junction based memory device of FIG. 12B, in accordance with example embodiments.

FIG. 14A illustrates a read path sequence 1400 for reading a one state utilizing the second read path variation 1220 of the alternative Josephson junction based memory device 1000 of FIG. 12B, in accordance with example embodiments.

Figure 14B:
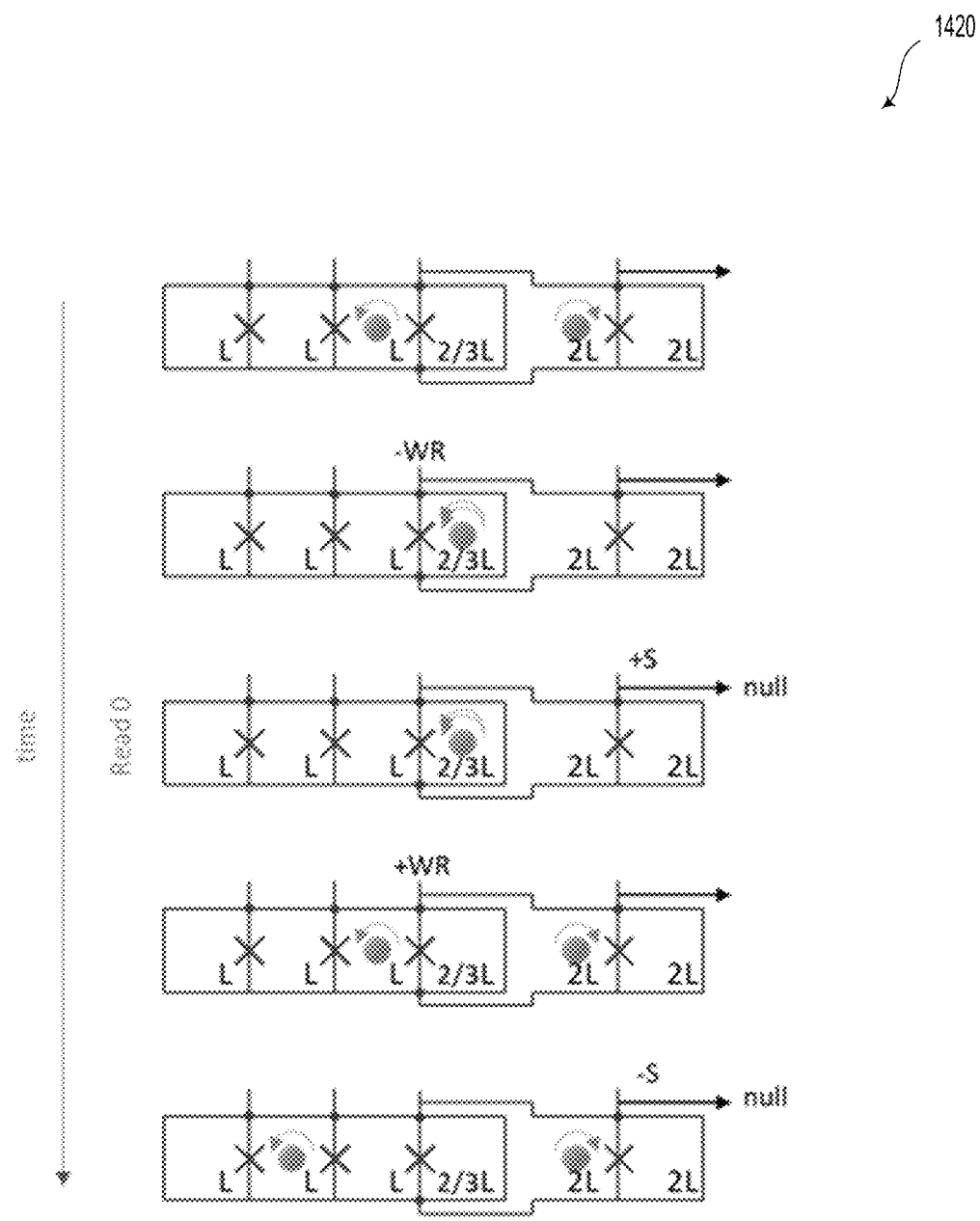
FIG. 14B illustrates a read path sequence for reading a zero state utilizing the second read path variation of the alternative Josephson junction based memory device of FIG. 12B, in accordance with example embodiments.

FIG. 14B illustrates a read path sequence 1420 for reading a zero state utilizing the second read path variation 1220 of the alternative Josephson junction based memory device 1000 of FIG. 12B, in accordance with example embodiments. In such scenarios, when reading a zero, the −WR signal merges both SFQs into the "2/3L" loop.

Figure 15A:
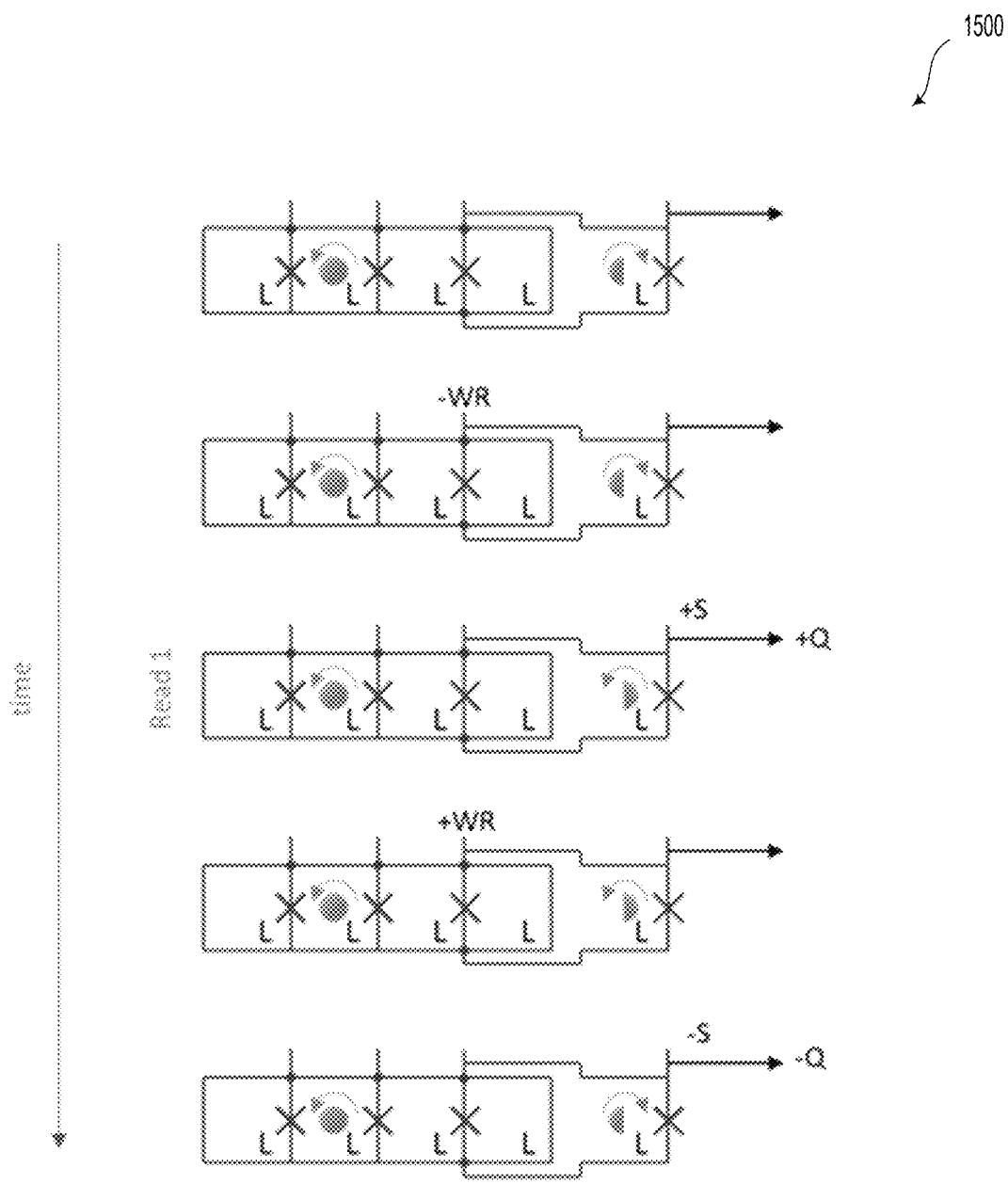
FIG. 15A illustrates a read path sequence for reading a one state utilizing the third read path variation of the alternative Josephson junction based memory device of FIG. 12C, in accordance with example embodiments.

FIG. 15A illustrates a read path sequence 1500 for reading a one state utilizing the third read path variation 1230 of the alternative Josephson junction based memory device 1000 of FIG. 12C, in accordance with example embodiments.

Figure 15B:
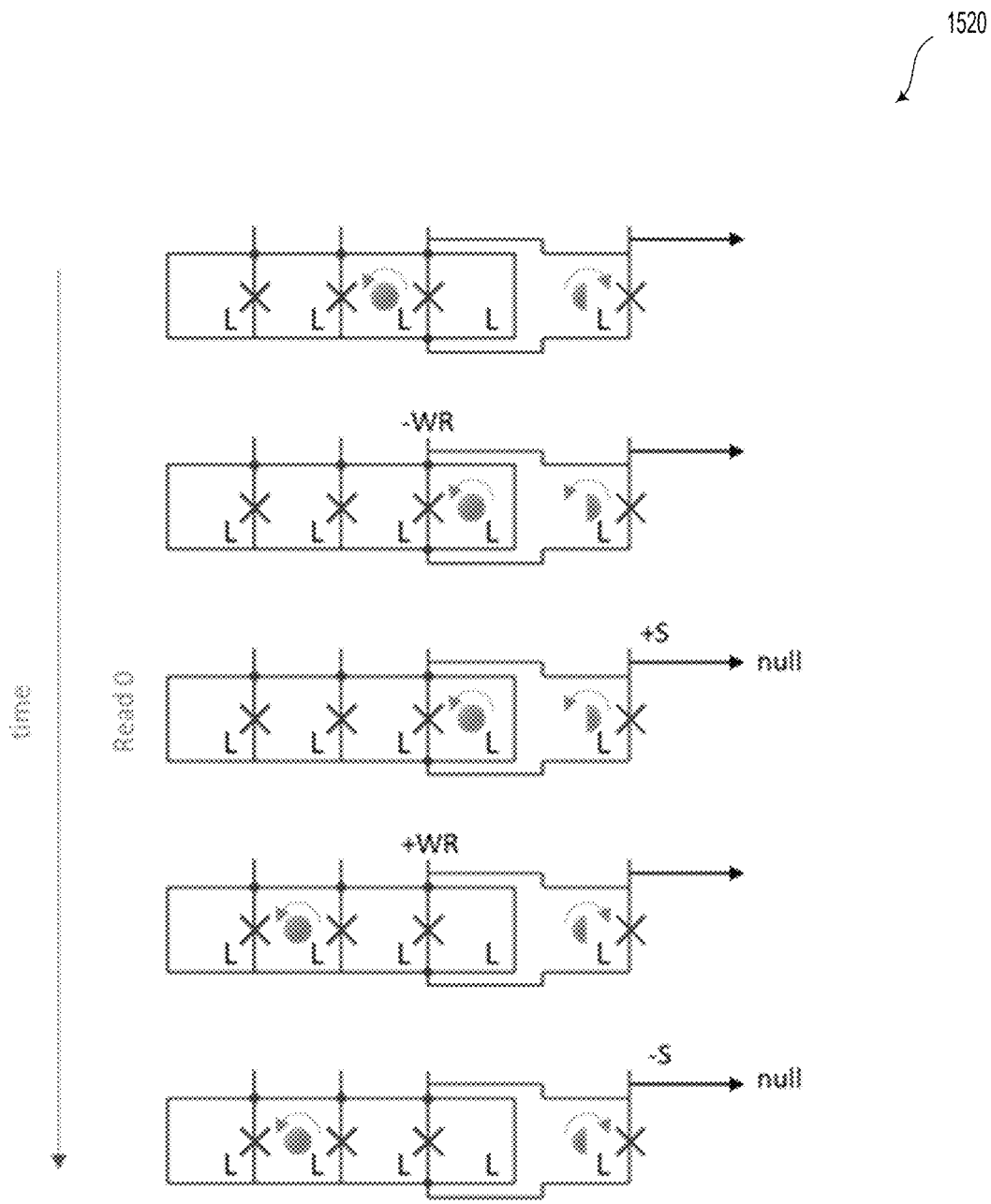
FIG. 15B illustrates a read path sequence for reading a zero state utilizing the third read path variation of the alternative Josephson junction based memory device of FIG. 12C, in accordance with example embodiments.

FIG. 15B illustrates a read path sequence 1520 for reading a zero state utilizing the third read path variation 1230 of the alternative Josephson junction based memory device 1000 of FIG. 12C, in accordance with example embodiments. In such scenarios, when reading a zero, the −WR signal reverses the polarity of the half-SFQ in the loop connected to the input stages.

Figure 16:
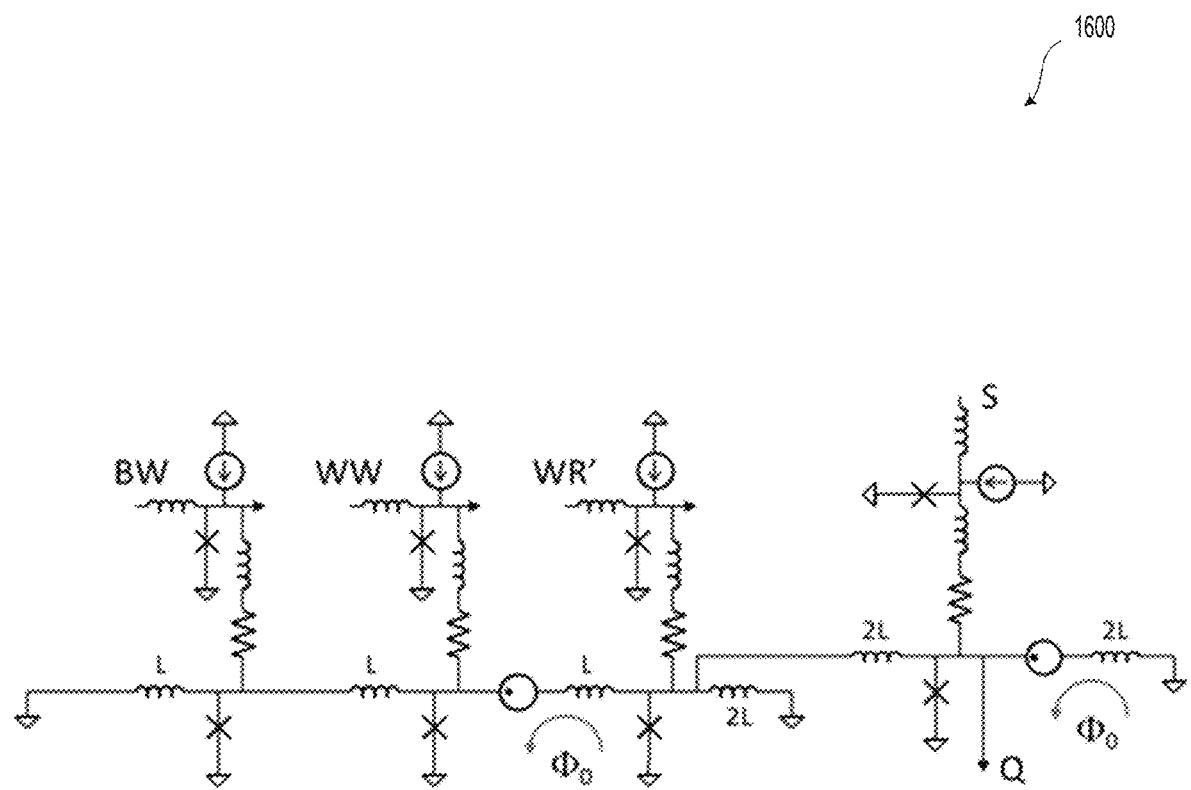
FIG. 16 illustrates a circuit diagram of the first read path variation of the alternative Josephson junction based memory device of FIG. 12A, in accordance with example embodiments.

FIG. 16 illustrates a circuit diagram 1600 of the first read path variation 1200 of the alternative Josephson junction based memory device 1000 of FIG. 12A, in accordance with example embodiments.

Figure 17:
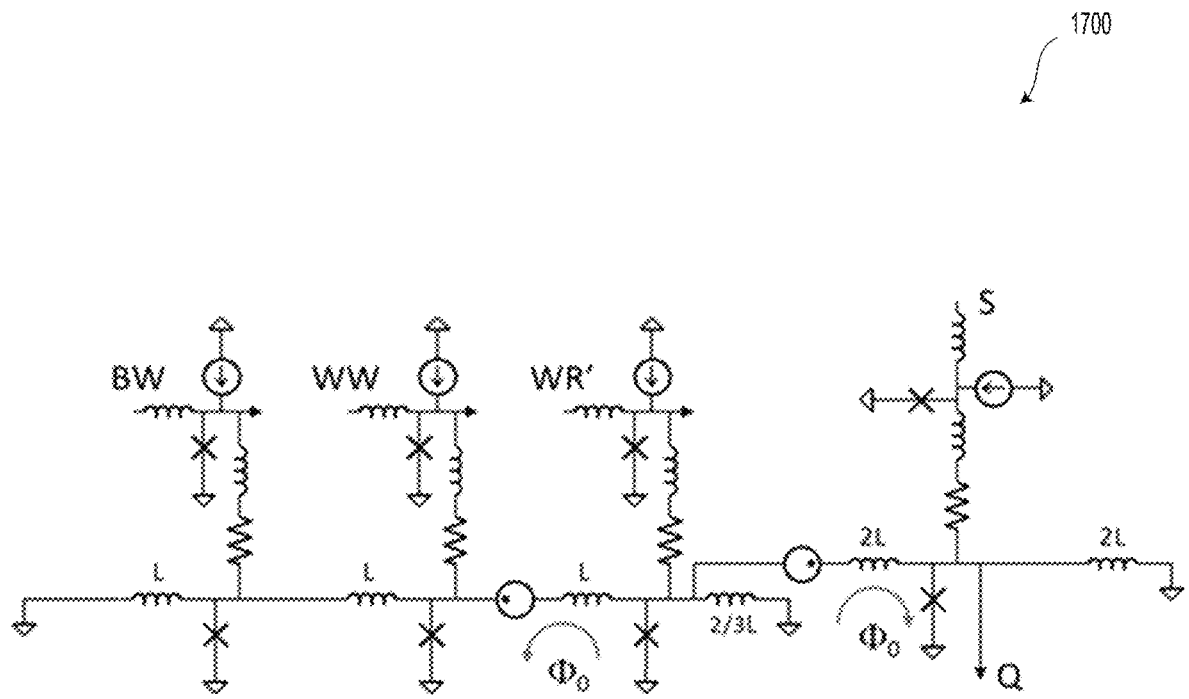
FIG. 17 illustrates a circuit diagram of the second read path variation of the alternative Josephson junction based memory device of FIG. 12B, in accordance with example embodiments.

FIG. 17 illustrates a circuit diagram 1700 of the second read path variation 1220 of the alternative Josephson junction based memory device 1000 of FIG. 12B, in accordance with example embodiments.

Figure 18:
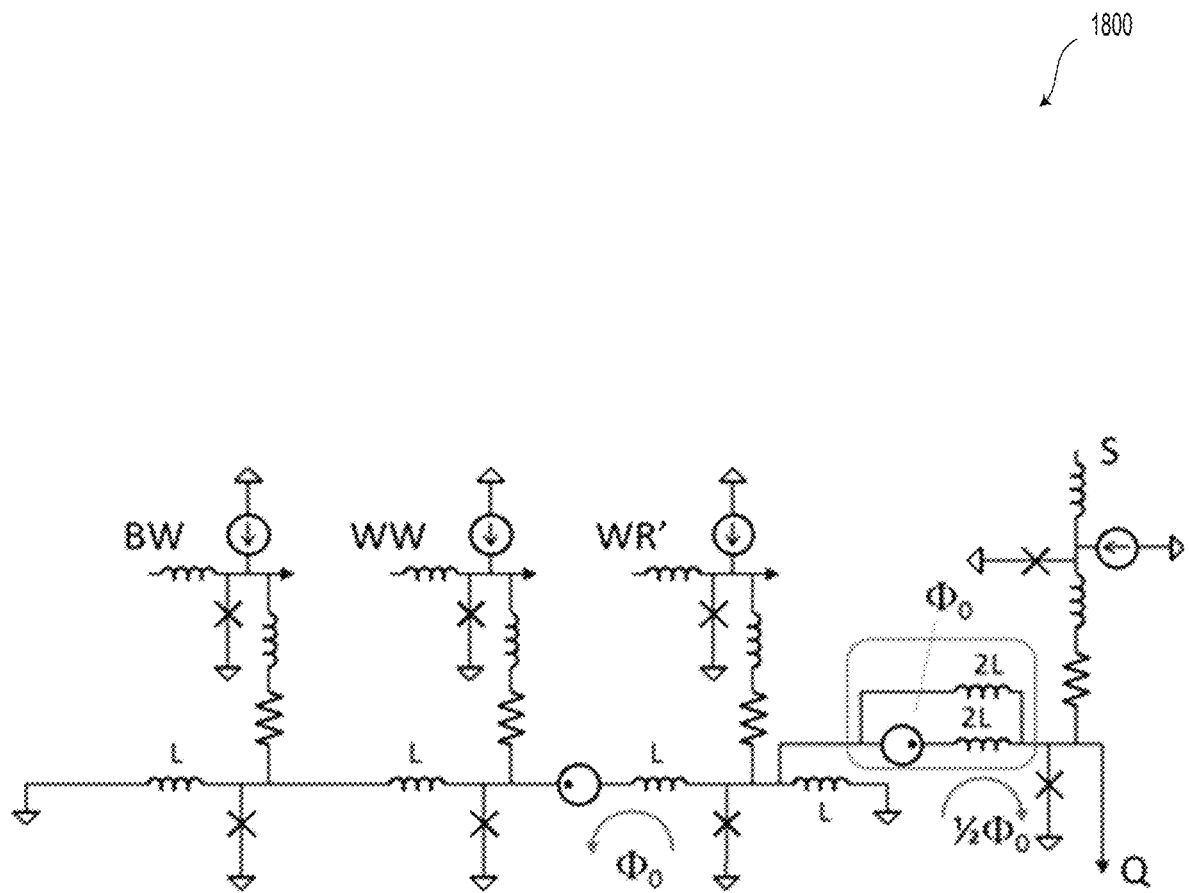
FIG. 18 illustrates a circuit diagram of the third read path variation of the alternative Josephson junction based memory device of FIG. 12C, in accordance with example embodiments.

FIG. 18 illustrates a circuit diagram 1800 of the third read path variation 1230 of the alternative Josephson junction based memory device 1000 of FIG. 12C, in accordance with example embodiments. The ½ SFQ in the inductor loop of inductance L is implemented as two inductors in parallel, each of inductance 2L, with a full SFQ applied to one of the two inductors.

Example Methods

Figure 19:
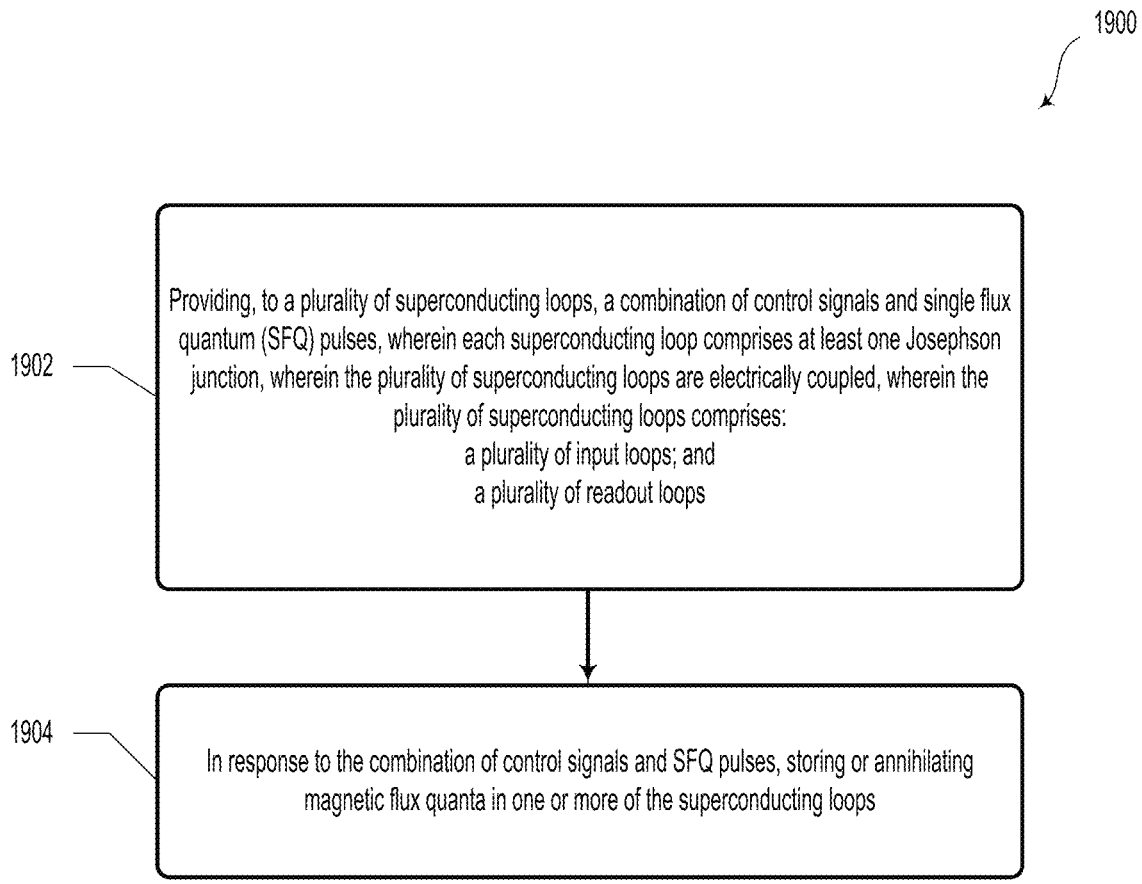
FIG. 19 illustrates a method, in accordance with example embodiments.

FIG. 19 illustrates a method 1900, in accordance with example embodiments. The method 1900 includes a process for storing digital information in a Josephson junction based memory device (e.g., memory device 100 or memory device 1000 as illustrated and described in relation to FIGS. 1 and 10).

The method 1900 includes providing, to a plurality of superconducting loops (e.g., superconducting loops 102), a combination of control signals and single flux quantum (SFQ) pulses. Each superconducting loop comprises at least one Josephson junction (e.g., Josephson junctions 104a, 104b, 104c, and 104d). The plurality of superconducting loops are electrically coupled. The plurality of superconducting loops include a plurality of input loops (e.g., input loops 110), a plurality of readout loops (e.g., readout loops 120), and at least one shared loop (e.g., shared loop 130).

The method 1900 includes, in response to the combination of control signals and SFQ pulses, storing or annihilating magnetic flux quanta (e.g., SFQ 140a and/or 140b) in one or more of the superconducting loops.

Method 1900 may additionally include, in response to an SFQ pulse being applied to an initial superconducting loop of the plurality of superconducting loops, shifting a magnetic flux quanta from the initial superconducting loop to an adjacent loop.

In some example embodiments, the Josephson junction based memory device may include a plurality of address lines coupled to the plurality of superconducting loops. In such scenarios, each address line of the plurality of address lines may include a Josephson transmission line and a current-bias source. The current-bias source provides an AC signal corresponding to a global resonant clock network (e.g., global resonant clock network 170).

In various examples, the control signals may include write control signals. wherein the plurality of address lines are configured to provide the write control signals to at least a portion of the plurality of superconducting loops. The write control signals include word write (WW) and bit write (BW).

In such examples, the control signals may additionally include read control signals. In such scenarios, the plurality of address lines are configured to provide the read control signals to at least a portion of the plurality of superconducting loops. The read control signals include word read (WR), strobe (S) and output.

In example embodiments, the method 1900 may also include, while cooling down the Josephson junction based memory device, providing an initialization signal via an at least one magnetically coupled control line.

In such scenarios, the method 1900 may additionally include, upon reaching a superconducting critical temperature of the Josephson junction based memory device, turning off the initialization signal such that an exact integral number of SFQ are stored in the plurality of superconducting loops.

Enumerated Example Embodiments

Embodiments of the present disclosure may thus relate to one of the enumerated example embodiments (EEEs) listed below.

EEE 1 includes a Josephson junction based memory device comprising:
a plurality of superconducting loops, wherein each superconducting loop comprises at least one Josephson junction, wherein the plurality of superconducting loops are electrically coupled, wherein the plurality of superconducting loops comprises:
a plurality of input loops;
a plurality of readout loops; and
at least one shared loop, wherein the plurality of superconducting loops are configured to store or annihilate magnetic flux quanta in one or more of the superconducting loops in response to a combination of control signals and single flux quantum (SFQ) pulses.

EEE 2 includes the Josephson junction based memory device of EEE 1, wherein the plurality of superconducting loops are electrically coupled in a series arrangement, wherein each superconducting loop of the plurality of superconducting loops has one or two adjacent loops.

EEE 3 includes the Josephson junction based memory device of EEE 2, wherein the plurality of superconducting loops are configured to shift a magnetic flux quanta from an initial superconducting loop to an adjacent loop in response to a SFQ pulse applied to the initial superconducting loop.

EEE 4 includes the Josephson junction based memory device of EEE 3, wherein the magnetic flux quanta is shifted from an initial superconducting loop to an adjacent loop in a first direction along the series arrangement in response to a positive SFQ pulse polarity, and wherein the magnetic flux quanta is shifted from an initial superconducting loop to an adjacent loop in a second direction along the series arrangement in response to a negative SFQ pulse polarity.

EEE 5 includes the Josephson junction based memory device of EEE 2, wherein the series arrangement comprises five superconducting loops, of which four are input loops, two are readout loops, and one is a shared loop.

EEE 6 includes the Josephson junction based memory device of EEE 2, further comprising a readout stage, wherein the series arrangement comprises four superconducting loops, of which all are input loops, wherein the readout stage is coupled to a Josephson junction of one of the input loops, wherein the readout stage is configured to detect whether an SFQ is stored in a specific one of the input loops.

EEE 7 includes the Josephson junction based memory device of EEE 2, wherein the series arrangement comprises a unit cell, wherein the Josephson junction based memory device comprises an array of unit cells that forms a memory fabric, wherein the memory fabric is wave-pipelined, and where multiple operations can be carried out simultaneously across the memory fabric.

EEE 8 includes the Josephson junction based memory device of EEE 7, wherein the unit cells of the memory fabric are coupled to a global resonant clock network.

EEE 9 includes the Josephson junction based memory device of EEE 1, further comprising a plurality of address lines coupled to the plurality of superconducting loops, wherein each address line of the plurality of address lines comprises:
  a Josephson transmission line; and
  a current-bias source, wherein the current-bias source provides an AC signal corresponding to a global resonant clock network.

EEE 10 includes the Josephson junction based memory device of EEE 9, wherein each address line of the plurality of address lines further comprises a resistor connected between the Josephson transmission line and a corresponding superconducting loop of the plurality of superconducting loops.

EEE 11 includes the Josephson junction based memory device of EEE 9, wherein the control signals comprise write control signals, wherein the plurality of address lines are configured to provide the write control signals to at least a portion of the plurality of superconducting loops, wherein the write control signals comprise:
  word write; and
  bit write.

EEE 12 includes the Josephson junction based memory device of EEE 9, wherein the plurality of superconducting loops are further configured to provide information indicative of a presence of the magnetic flux quanta in the one or more of the superconducting loops in response to a combination of control signals and SFQ pulses.

EEE 13 includes the Josephson junction based memory device of EEE 9, wherein the control signals comprise read control signals, wherein the plurality of address lines are configured to provide the read control signals to at least a portion of the plurality of superconducting loops, wherein the read control signals comprise:
  word read;
  strobe; and
  output.

EEE 14 includes the Josephson junction based memory device of EEE 1, further comprising at least one magnetically coupled control line, wherein the plurality of superconducting loops are further configured to provide an initial flux state in response to a two-step flux initialization process, wherein the two-step flux initialization process comprises:
  while cooling down the Josephson junction based memory device, providing an initialization signal via the at least one magnetically coupled control line; and
  upon reaching a superconducting critical temperature of the Josephson junction based memory device, turning off the initialization signal such that an exact integral number of SFQ are stored in the plurality of superconducting loops.

EEE 15 includes a method for storing digital information in a Josephson junction based memory device comprising:
  providing, to a plurality of superconducting loops, a combination of control signals and single flux quantum (SFQ) pulses, wherein each superconducting loop comprises at least one Josephson junction, wherein the plurality of superconducting loops are electrically coupled, wherein the plurality of superconducting loops comprises:
    a plurality of input loops;
    a plurality of readout loops; and
    at least one shared loop; and
  in response to the combination of control signals and SFQ pulses, storing or annihilating magnetic flux quanta in one or more of the superconducting loops.

EEE 16 includes the method of EEE 15, further comprising:
  in response to an SFQ pulse being applied to an initial superconducting loop of the plurality of superconducting loops, shifting a magnetic flux quanta from the initial superconducting loop to an adjacent loop.

EEE 17 includes the method of EEE 15, wherein the Josephson junction based memory device comprises a plurality of address lines coupled to the plurality of superconducting loops, wherein each address line of the plurality of address lines comprises:
  a Josephson transmission line; and
  a current-bias source, wherein the current-bias source provides an AC signal corresponding to a global resonant clock network.

EEE 18 includes the method of EEE 17, wherein the control signals comprise write control signals, wherein the plurality of address lines are configured to provide the write control signals to at least a portion of the plurality of superconducting loops, wherein the write control signals comprise:
  word write; and
  bit write.

EEE 19 includes the method of EEE 17, wherein the control signals comprise read control signals, wherein the plurality of address lines are configured to provide the read control signals to at least a portion of the plurality of superconducting loops, wherein the read control signals comprise:
  word read;
  strobe; and
  output.

EEE 20 includes the method of EEE 15, further comprising:
  while cooling down the Josephson junction based memory device, providing an initialization signal via an at least one magnetically coupled control line; and
  upon reaching a superconducting critical temperature of the Josephson junction based memory device, turning off the initialization signal such that an exact integral number of SFQ are stored in the plurality of superconducting loops.

While some embodiments have been illustrated and described in detail in the appended drawings and the foregoing description, such illustration and description are to be considered illustrative and not restrictive. Other variations to the disclosed embodiments can be understood and effected in practicing the claims, from a study of the drawings, the disclosure, and the appended claims. The mere fact that certain measures or features are recited in mutually different dependent claims does not indicate that a combination of these measures or features cannot be used. Any reference signs in the claims should not be construed as limiting the scope.

What is claimed is:

1. A Josephson junction based memory device comprising:
  a plurality of superconducting loops wherein each superconducting loop comprises at least one Josephson junction, wherein the plurality of superconducting loops are electrically coupled in a series arrangement, wherein each superconducting loop of the plurality of superconducting loops has one or two adjacent loops, and wherein the plurality of superconducting loops comprises:
a plurality of input loops;
a plurality of readout loops; and
at least one shared loop, wherein the plurality of superconducting loops are configured to store or annihilate magnetic flux quanta in one or more of the superconducting loops in response to a combination of control signals and single flux quantum (SFQ) pulses, wherein the plurality of superconducting loops are configured to shift a magnetic flux quanta from an initial superconducting loop to an adjacent loop in response to a SFQ pulse applied to the initial superconducting loop, wherein the magnetic flux quanta is shifted from an initial superconducting loop to an adjacent loop in a first direction along the series arrangement in response to a positive SFQ pulse polarity, and wherein the magnetic flux quanta is shifted from an initial superconducting loop to an adjacent loop in a second direction along the series arrangement in response to a negative SFQ pulse polarity.

2. The Josephson junction based memory device of claim 1, wherein the series arrangement comprises five superconducting loops, of which four are input loops, two are readout loops, and one is a shared loop.

3. The Josephson junction based memory device of claim 1, further comprising a readout stage, wherein the series arrangement comprises four superconducting loops, of which all are input loops, wherein the readout stage is coupled to a Josephson junction of one of the input loops, wherein the readout stage is configured to detect whether an SFQ is stored in a specific one of the input loops.

4. The Josephson junction based memory device of claim 1, wherein the series arrangement comprises a unit cell, wherein the Josephson junction based memory device comprises an array of unit cells that forms a memory fabric, wherein the memory fabric is wave-pipelined, and where multiple operations can be carried out simultaneously across the memory fabric.

5. The Josephson junction based memory device of claim 4, wherein the unit cells of the memory fabric are coupled to a global resonant clock network.

6. The Josephson junction based memory device of claim 1, further comprising a plurality of address lines coupled to the plurality of superconducting loops, wherein each address line of the plurality of address lines comprises:
a Josephson transmission line; and
a current-bias source, wherein the current-bias source provides an AC signal corresponding to a global resonant clock network.

7. The Josephson junction based memory device of claim 6, wherein each address line of the plurality of address lines further comprises a resistor connected between the Josephson transmission line and a corresponding superconducting loop of the plurality of superconducting loops.

8. The Josephson junction based memory device of claim 6, wherein the control signals comprise write control signals, wherein the plurality of address lines are configured to provide the write control signals to at least a portion of the plurality of superconducting loops, wherein the write control signals comprise:
word write; and
bit write.

9. The Josephson junction based memory device of claim 6, wherein the plurality of superconducting loops are further configured to provide information indicative of a presence of the magnetic flux quanta in the one or more of the superconducting loops in response to a combination of control signals and SFQ pulses.

10. The Josephson junction based memory device of claim 6, wherein the control signals comprise read control signals, wherein the plurality of address lines are configured to provide the read control signals to at least a portion of the plurality of superconducting loops, wherein the read control signals comprise:
word read;
strobe; and
output.

11. The Josephson junction based memory device of claim 1, further comprising at least one magnetically coupled control line, wherein the plurality of superconducting loops are further configured to provide an initial flux state in response to a two-step flux initialization process, wherein the two-step flux initialization process comprises:
while cooling down the Josephson junction based memory device, providing an initialization signal via the at least one magnetically coupled control line; and
upon reaching a superconducting critical temperature of the Josephson junction based memory device, turning off the initialization signal such that an exact integral number of SFQ are stored in the plurality of superconducting loops.

12. A method for storing digital information in a Josephson junction based memory device comprising:
providing, to a plurality of superconducting loops, a combination of control signals and single flux quantum (SFQ) pulses, wherein each superconducting loop comprises at least one Josephson junction, wherein the plurality of superconducting loops are electrically coupled, wherein the plurality of superconducting loops comprises:
a plurality of input loops;
a plurality of readout loops; and
at least one shared loop;
in response to the combination of control signals and SFQ pulses, storing or annihilating magnetic flux quanta in one or more of the superconducting loops;
while cooling down the Josephson junction based memory device, providing an initialization signal via an at least one magnetically coupled control line; and
upon reaching a superconducting critical temperature of the Josephson junction based memory device, turning off the initialization signal such that an exact integral number of SFQ are stored in the plurality of superconducting loops.

13. The method of claim 12, further comprising:
in response to an SFQ pulse being applied to an initial superconducting loop of the plurality of superconducting loops, shifting a magnetic flux quanta from the initial superconducting loop to an adjacent loop.

14. The method of claim 12, wherein the Josephson junction based memory device comprises a plurality of address lines coupled to the plurality of superconducting loops, wherein each address line of the plurality of address lines comprises:
a Josephson transmission line; and
a current-bias source, wherein the current-bias source provides an AC signal corresponding to a global resonant clock network.

15. The method of claim 14, wherein the control signals comprise write control signals, wherein the plurality of address lines are configured to provide the write control signals to at least a portion of the plurality of superconducting loops, wherein the write control signals comprise:
- word write; and
- bit write.

16. The method of claim 14, wherein the control signals comprise read control signals, wherein the plurality of address lines are configured to provide the read control signals to at least a portion of the plurality of superconducting loops, wherein the read control signals comprise:
- word read;
- strobe; and
- output.

* * * * *